(12) United States Patent
Ohba et al.

(10) Patent No.: US 7,756,655 B2
(45) Date of Patent: Jul. 13, 2010

(54) OBSERVATION APPARATUS, OBSERVATION METHOD AND PROGRAM

(75) Inventors: Nobuyuki Ohba, Sendai (JP); Kohji Takano, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 247 days.

(21) Appl. No.: 11/680,542

(22) Filed: Feb. 28, 2007

(65) Prior Publication Data

US 2007/0203675 A1 Aug. 30, 2007

(51) Int. Cl.
*G01R 13/00* (2006.01)

(52) U.S. Cl. ........................................ 702/74

(58) Field of Classification Search .................. 702/57, 702/74, 75, 78, 80, 90, 117, 119, 183, 188, 702/190; 455/435.1; 341/61; 370/331, 352; 717/124; 714/138, 727
See application file for complete search history.

(56) References Cited

U.S. PATENT DOCUMENTS

| | | | |
|---|---|---|---|
| 5,576,979 A | 11/1996 | Lewis et al. | |
| 5,920,711 A | 7/1999 | Seawright et al. | |
| 6,289,489 B1 | 9/2001 | Bold et al. | |
| 6,553,514 B1 | 4/2003 | Baumgartner et al. | |
| 6,647,513 B1 | 11/2003 | Hekmatpour | |
| 6,751,582 B1 | 6/2004 | Andersen et al. | |
| 2003/0229835 A1* | 12/2003 | Whetsel | 714/727 |
| 2005/0195803 A1* | 9/2005 | Hosokubo | 370/352 |

FOREIGN PATENT DOCUMENTS

| | | |
|---|---|---|
| JP | 61253555 | 11/1986 |
| JP | 07-111042 | 4/1995 |
| JP | 8170972 | 7/1996 |
| JP | 09-130354 | 5/1997 |
| JP | 2002010064 | 11/2002 |
| JP | 2003526859 | 9/2003 |
| JP | 2006113696 | 4/2006 |

OTHER PUBLICATIONS

Kohji Takano et al., Hardware Design Verification Method Based on the Signal Transitions and Transaction, pp. 1-6.
Kohji Takano et al., "State Transition Separation Method for Signal Transaction Based Hardware Design Verification", The 19th Workshop on Circuits and Systems in Karuizawa, Apr. 24-25, 2006, pp. 595-600.

* cited by examiner

*Primary Examiner*—Mohamed Charioui
(74) *Attorney, Agent, or Firm*—Ido Tuchman; Shimokaji & Associates, P.C.

(57) ABSTRACT

An observation apparatus which observers operations of an observation target apparatus, and which includes: an output signal acquisition unit for sequentially acquiring signal values by observing signals outputted by the observation target apparatus; a state storage unit for sequentially storing the acquired signal values; a determination unit for determining whether a first signal value newly acquired is identical with a second signal value which is acquired prior to the first signal value, and which is stored in the state storage unit; and a separation unit for separating and outputting a signal sequence, which includes a plurality of signal values acquired between the first signal value and the second signal value, as transactions of the output signals, on condition that it is determined that the first signal value is identical with the second signal value.

1 Claim, 18 Drawing Sheets

| ID | TRANSACTION | | | | |
|----|------------|------------|------------|------------|------------|
| 00 | 0000000000 | 1111101111 | | | |
| 01 | 1111100000 | | | | |
| 02 | 1111101111 | | | | |
| 03 | 0111100111 | 1101100000 | 1001100000 | 1111100000 | 1111100110 |
| 04 | 0111100011 | 1101101110 | | | |
| 05 | 1001101110 | 1111101110 | 1111100000 | | |
| 06 | 0111100010 | 1101101101 | | | |
| 07 | 1001101101 | 1111101101 | 1111101111 | | |
| 08 | 0111100111 | | | | |
| 09 | 1101100000 | 1001100000 | 1111100000 | 1111100110 | |
| ⋮ | ⋮ | | | | |

FIG. 4

| ID | OCCURRENCE FREQUENCY |
|----|---------------------|
| 01 | 3457251 |
| 02 | 3397722 |
| 69 | 568112 |
| 03 | 530928 |
| 33 | 300765 |
| 53 | 176117 |
| 29 | 129378 |
| 07 | 93479 |
| 06 | 92886 |
| 05 | 92733 |
| ⋮ | ⋮ |

| | 1101101111 | 1111001000 | 1111001001 | 1111001100 | 1111001101 | 1111011000 | 1111011100 | 1111011101 | 111101 |
|---|---|---|---|---|---|---|---|---|---|
| 1101101111 | | | | | | | | | |
| 1111001000 | | 000000023e712 | 000000024712 | 0000000000024d | 00000003b35d | 000000181fb0 | | | 0000000 |
| 1111001001 | | | | | | 0000000000d3b2 | | | |
| 1111001100 | | 000000004887e | 000008e7f069 | 0000013dbb5b | 00000026d86d | | | | 0000014 |
| 1111001101 | | 00000001792cf | 00000001e106 | 0000000001ac | 000017c57902 | 000001765cc | | | 0000000 |
| 1111011000 | | | | | | | | | |
| 1111011100 | | 000000034305 | 000000029cf3 | 00000009230 | 000000000de | 000000000e829 | | | 0000011 |
| 1111011101 | | | 00000526acee | | 000000007565b | 00000000259 | | | |
| 1111101100 | | | | 000002c09c2 | 00000b50a916 | | | | 0000022 |
| 1111101101 | | | | | | | | | |
| 1111101110 | | | | 0000000000040a | | | | | |
| 1111101111 | ⌐00000000001¬ | 000000000001a | | | | 000000026623 | | | |
| 1111111100 | | | 000000001770d | | 000000003345e8 | | | | 0000000 |
| 1111111101 | | | 000000053bfc | | | | | | 0000000 |
| 1111111110 | | | | | | | | | |
| 1111111111 | | | | | | | | | |

OBSERVATION APPARATUS, OBSERVATION METHOD AND PROGRAM

CROSS-REFERENCE TO RELATED APPLICATIONS

This application claims priority under 35 U.S.C. §119 to Japanese Patent Application No. 2006-51843 filed Feb. 28, 2006, the entire text of which is specifically incorporated by reference herein.

BACKGROUND OF THE INVENTION

The present invention relates to an observation apparatus, observation method and program. In particular, the present invention relates to an observation apparatus, observation method and program, which observe an operation of an observation target apparatus.

Techniques which support the debugging of a designed logic circuit are disclosed in the following documents: "Hardware Design Verification Technique Based on Signal State Change and State Transition" by Koji Takano and Nobuyuki Ohba, Program and Proceedings of 18th Karuizawa Workshop on Circuit and System, pp. 563-568, Apr. 25, 2005 (hereinafter referred to as Non-patent Document 1); Japanese Patent Laid-Open Official Gazette No. 2002-10064 (hereinafter referred to as Patent Document 1); Japanese Patent Laid-Open Official Gazette No. Hei-9(1997)-130354 (hereinafter referred to as Patent Document 2); Japanese Patent Laid-Open No. Hei-7(1995)-111042 (hereinafter referred to as Patent Document 3); Published Translation of PCT Application No. 2003-526859 (hereinafter referred to as Patent Document 4); U.S. Pat. No. 5,576,979 (hereinafter referred to as Patent Document 5); U.S. Pat. No. 6,289,489 (hereinafter referred to as Patent Document 6); U.S. Pat. No. 5,920,711 (hereinafter referred to as Patent Document 7); U.S. Pat. No. 6,553,514 (hereinafter referred to as Patent Document 8); U.S. Pat. No. 6,751,582 (hereinafter referred to as Patent Document 9); and U.S. Pat. No. 6,647,513 (hereinafter referred to as Patent Document 10). Non-patent Document 1 describes that signals are observed on a per-transaction basis.

Patent Document 1 describes that digital data streams are classified in accordance with the features. Patent Document 2 describes that digital data is classified on a per-packet basis. Patent Document 3 describes that reduction in amplitude of a signal wave caused by inter-code interference is corrected. Patent Document 4 describes that signals are periodically decomposed to perform a statistical hypothesis test.

Patent Document 5 describes that creation of a timing diagram of an electronic circuit is supported. Patent Document 6 describes that a hardware description language (HDL) for logic circuit is associated with a state of the logic circuit displayed via a graphical user interface (GUI) to enable cross reference. Patent Document 7 describes that a hardware description for logic circuit, where a communication protocol designated by a user is implemented, is generated. Patent Document 8 describes that formal verification is carried out based on a result of software simulation. Patent Document 9 describes that GUI for carrying out efficient formal verification is provided. Patent Document 10 describes that a test case for function verification is efficiently provided to display coverage of verification items.

Verification techniques for a designed logic circuit include a method in which a logic circuit to be verified is converted to hardware such as a device, e.g., FPG or a prototype of an actual device so as to carry out verification. Verification using conversion to hardware makes it possible to verify failure occurred in a state where parts are connected.

Incidentally, in the case of verification using hardware, since the number of parts is large, massive signal transitions occur. Furthermore, since the logic circuit to be verified operates in a real time, the logic circuit has to be verified at high speed. In contrast to this, when debugging proceeds, frequency of occurrence of failure decreases to, for example, about once per several days. This makes it difficult to specify which timing failure occurs at.

Non-patent Documents 1 and 2 propose that signals outputted from the observation target apparatus are observed on a per-transaction basis for the purpose of solving the aforementioned problem. When the signals outputted from the observation target apparatus are observed on a per-transaction basis, it is possible to discover a transaction with a low frequency of occurrence without having foreknowledge. Accordingly, even in the case of verifying a system having a large number of parts and operating at high speed, it is possible to efficiently analyze behavior that a user does not expect, failure with a low frequency of occurrence and the like.

However, for separating signals into transactions, the user, for example, presets a division condition to thereby cause improvement in analytic efficiency to be hampered.

BRIEF SUMMARY OF THE INVENTION

Accordingly, an object of the present invention is to provide an observation apparatus, observation method and program, which can solve the aforementioned problem. This object can be achieved by combining features described in independent claims in the scope of claims for patent. Moreover, the dependent claims specify further advantageous detailed examples of the present invention.

According to a first aspect of the present invention, there is provided an observation apparatus which observes operations of an observation target apparatus, the observation apparatus including: an output signal acquisition unit for sequentially acquiring signal values by observing signals outputted by the observation target apparatus; a state storage unit for sequentially storing the acquired signal values; a determination unit for determining whether a first signal value newly acquired is identical with a second signal value which is acquired prior to the first signal value, and which is stored in the state storage unit; and a separation unit for separating a signal sequence, which includes a plurality of signal values acquired between the first signal value and the second signal value, as transactions of the output signals, and for outputting a result, on condition that it is determined that the first signal value is identical with the second signal value. There are also provided an observation method and a program in connection with the observation apparatus.

According to a second aspect of the present invention, there is provided an observation apparatus which observes operations of an observation target apparatus, the observation apparatus including: an output signal acquisition unit for sequentially acquiring signal values by observing signals outputted by the observation target apparatus; a state storage unit for sequentially storing the acquired signal values; a frequency measurement unit for measuring, for each signal value, the number of times the corresponding signal value is outputted, as a state occurrence frequency; and an idle specifying unit for specifying signal values of the signals outputted by the observation target apparatus which are in an idle state, based on the state occurrence frequency measured for each of the plurality of signal values. There are also provided an observation method and a program in connection with the observation apparatus.

Note that the summary of the aforementioned invention does not include descriptions of all essential features of the present invention, and that sub-combinations of these feature groups may also constitute the present invention.

According to the present invention, in a case where the first signal value newly acquired from the observation target apparatus is identical with the second signal value acquired prior to the first signal value, the signal sequence, including a plurality of signal values acquired between the first signal value and the second signal value, is separated as a transaction. Thus, according to the present invention, it is possible to separate the output signals outputted from the observation target apparatus into transactions. Moreover, according to the present invention, the values in a case where the signal is in an idle state are specified based on the state occurrence frequency of the plurality of signal values of the signal outputted from the observation target apparatus. Thus, according to the present invention, the values in a case where the signal outputted from the observation target apparatus is in an idle state can be efficiently specified.

BRIEF DESCRIPTION OF THE SEVERAL VIEWS OF THE DRAWINGS

For a more complete understanding of the present invention and the advantage thereof, reference is now made to the following description taken in conjunction with the accompanying drawings.

FIG. 4 shows an example of transactions measured by a first frequency measurement unit 30 according to the embodiment of the present invention.

FIG. 5 shows an example of transaction occurrence frequencies.

FIG. 13 shows an example of a display in a table format by the observation apparatus 20 according to the embodiment of the present invention.

DETAILED DESCRIPTION OF THE INVENTION

The following will explain the present invention by use of the embodiment of the invention, but the following embodiment does not limit the invention claimed in the scope of claims, and all combinations of features explained in the embodiment are not always essential as solving means of the invention.

Figure 1:
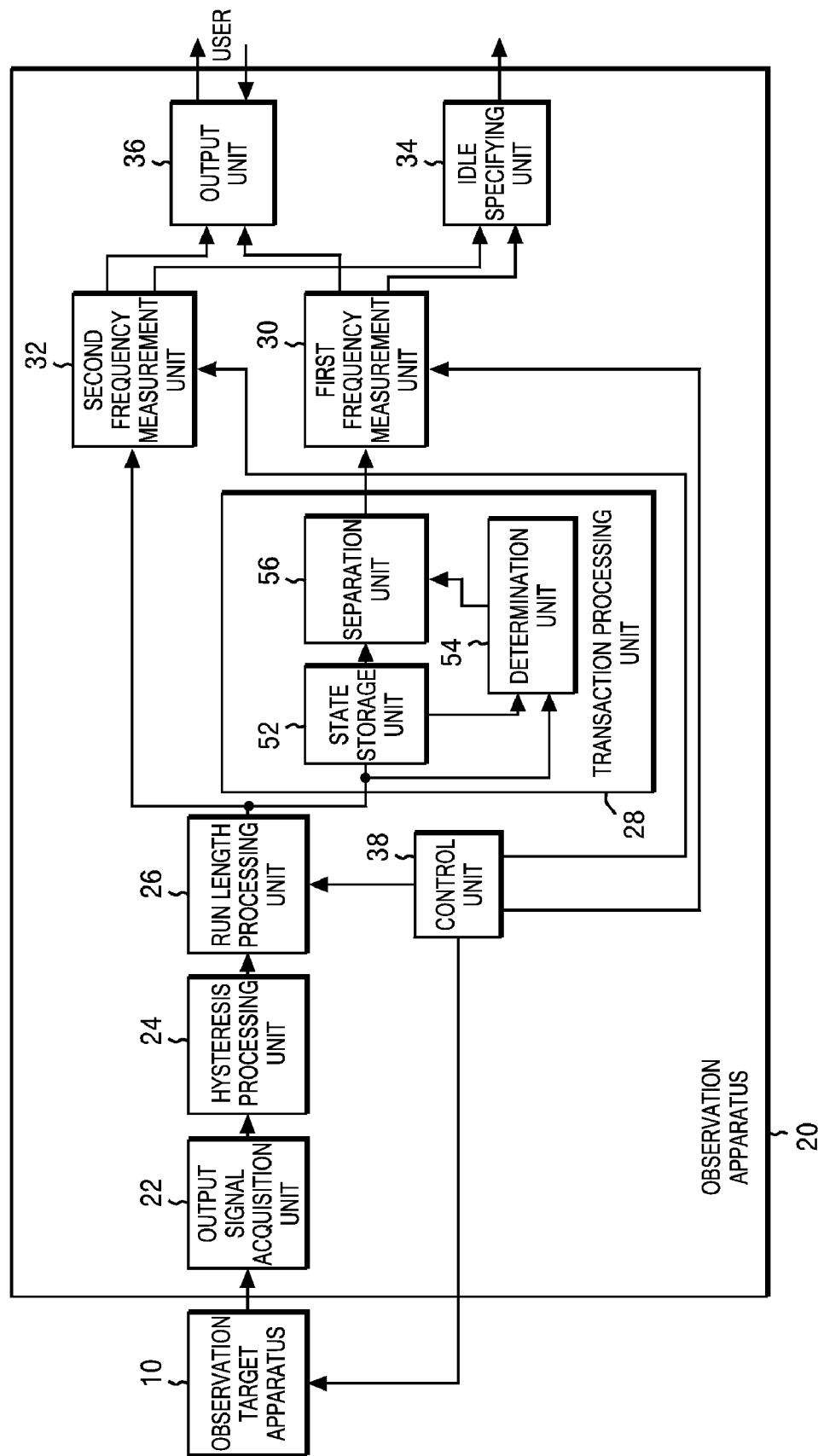
FIG. 1 shows a configuration of an observation apparatus 20 according to an embodiment of the present invention together with an observation target apparatus 10.

FIG. 1 shows a configuration of an observation apparatus 20 according to this embodiment, together with an observation target apparatus 10. The observation target apparatus 10 is an apparatus to be observed, namely, an apparatus which includes one or a plurality of hardware emulators each using, for example, an LSI on which a logic circuit to be verified is mounted and/or an FPGA in which a logic circuit to be verified is programmed, or the like.

Signals outputted from the observation target apparatus 10 are inputted to the observation apparatus 20, and the observation apparatus 20 observes operations of the observation target apparatus 10. The signals outputted from the observation target apparatus 10 to the observation apparatus 20 may be interface signals among parts in the observation target apparatus 10, signals extracted for observation from the logic circuit in the observation target apparatus 10, output interface signals of the observation target apparatus 10, or the like. Then, the observation apparatus 20 detects an operation or the like in which failure will occur with a high possibility, and makes a notification of a detection result to a user of the observation apparatus 20 and to other observation apparatuses such as a logic analyzer connected to the observation target apparatus 10 and the observation apparatus 20.

Here, the observation apparatus 20 divides the output signals from the observation target apparatus 10 on a consecutive state transition basis or on a plurality of consecutive state transitions basis, and treats a bundle of divided signal transitions as one transaction. Then, the observation apparatus 20 observes the output signals on a per-transaction basis. This enables the observation apparatus 20 to observe behavior of the output signals with a higher degree of abstraction. Accordingly, even in the case of observing the observation target apparatus 10 having a large number of parts and operating at high speed, the observation apparatus 20 is capable of performing an efficient analysis.

The observation apparatus 20 includes an output signal acquisition unit 22, a hysteresis processing unit 24, a run length processing unit 26, a transaction processing unit 28, a first frequency measurement unit 30, a second frequency measurement unit 32, an idle specifying unit 34, an output unit 36, and a control unit 38.

The output signal acquisition unit 22 observes the signals outputted from the observation target apparatus 10, and sequentially acquires signal values for each cycle on the observation apparatus 20. Here, data of the output signals may be a fixed- or variable-length bit string, and may be transmitted through a signal line from the object target apparatus 10 to the observation apparatus 20 over one or a plurality of cycles of the signal line. Namely, for example, in a case where the output signals are eight bits and the signal line is one bit, the output signals for one cycle on the observation apparatus 20 are transmitted over eight cycles of the signal line.

The output signals acquired by the output signal acquisition unit 22 are inputted to the hysteresis processing unit 24. The hysteresis processing unit 24 adds hysteresis thereto, and outputs the result. The run length processing unit 26 converts the output signals acquired by the output signal acquisition unit 22 to a data format which is expressed by a pair of a value and a consecutive length (the number of repetitions) of the value. The output signals may be inputted to the run length processing unit 26 through the hysteresis processing unit 24.

Signal values of the output signals acquired by the output signal acquisition unit 22 are sequentially inputted in time series, as states of output signals, to the transaction processing unit 28. The output signals may be inputted to the transaction processing unit 28 through the run length processing unit 26. Then, in a case where the transitions of the states inputted in time series return from a certain state to the same state to form a closed path, the transaction processing unit 28 extracts a series of state transitions, which forms the closed path, as one transaction. Furthermore, in the case of extracting the closed path as the transaction, the transaction processing unit 28 may also extract state transitions leading to the closed path as one transaction. Moreover, in a case where a state unchanged for a predetermined period is inputted, the transaction processing unit 28 may extract the state unchanged for a predetermined period as one transaction.

More specifically, the transaction processing unit 28 includes a state storage unit 52, a determination unit 54, and a separation unit 56. The state storage unit 52 sequentially stores acquired signal values as output signal states. The determination unit 54 determines whether or not a first signal value newly acquired is identical with a second signal value acquired prior to the first signal value and stored in the state storage unit 52. On condition that it is determined that the first signal value is identical with the second signal value, the separation unit 56 separates a signal sequence, which includes a plurality of signal values acquired between the first signal value and the second signal value, as a transaction of output signals, and outputs the result. Accordingly, the transaction processing unit 28 can detect a closed path formed by a state (signal value) returning to the same state (signal value), and separate a transaction from the output signals of the observation target apparatus 10.

The first frequency measurement unit 30 measures the number of times the transactions are outputted, as a transaction frequency for each transaction outputted from the separation unit 56 in the transaction processing unit 28. For every signal value, the second frequency measurement unit 32 measures the number of times the signal value is outputted, as a state occurrence frequency. The values of the output signals of the observation target apparatus 10 may be inputted to the second frequency measurement unit 32 through the run length processing unit 26 or hysteresis processing unit 24.

Based on the state occurrence frequency of each transaction measured by the first frequency measurement unit 30, the idle specifying unit 34 specifies signal values in a case where the signals outputted from the observation target apparatus 10 are in an idle state. In addition to this, based on the state occurrence frequency of each of the plurality of signal values of the output signals measured by the second frequency measurement unit 32, the idle specifying unit 34 may specify signal values in a case where the signals outputted from the observation target apparatus 10 are in an idle state.

The output unit 36 outputs the frequencies of the transactions measured by the first frequency measurement unit 30 and information on the transactions as a measurement source. The output unit 36 also outputs the state occurrence frequencies measured by the second frequency measurement unit 32 and information on the state transitions as a measurement source. The output unit 36 of this embodiment displays information to the user in the form of graph and table, for example. The control unit 38 sets a load on the object target apparatus 10 and sets the upper limit number of repetition times of the run length processing unit 26, and controls measurement by the first frequency measurement unit 30 or the second frequency measurement unit 32.

The aforementioned observation apparatus 20 detects a closed path formed by a state returning to the same state, to thereby separate a transaction from the output signals. This enables the observation apparatus 20 to automatically separate a transaction even if an idle state serving as discontinuity of the transactions is not set beforehand.

Furthermore, in most of protocols for signal transmission, there is no case where signals having the same meaning and contents are transmitted for a plurality of times in a single transaction. For this reason, if the same state occurs, there is a high probability that this point is the discontinuity of the transactions. The observation apparatus 20 separates a transaction at the time when a state of output signals returns to the same state, thereby making it possible to separate a bundle of state transitions having some meaning as one transaction. Accordingly, the observation apparatus 20 observes output signals of the observation target apparatus 10 on a per-transaction basis, the transactions being thus separated, thereby enabling, for example, failure contents to be efficiently specified.

Figure 2:
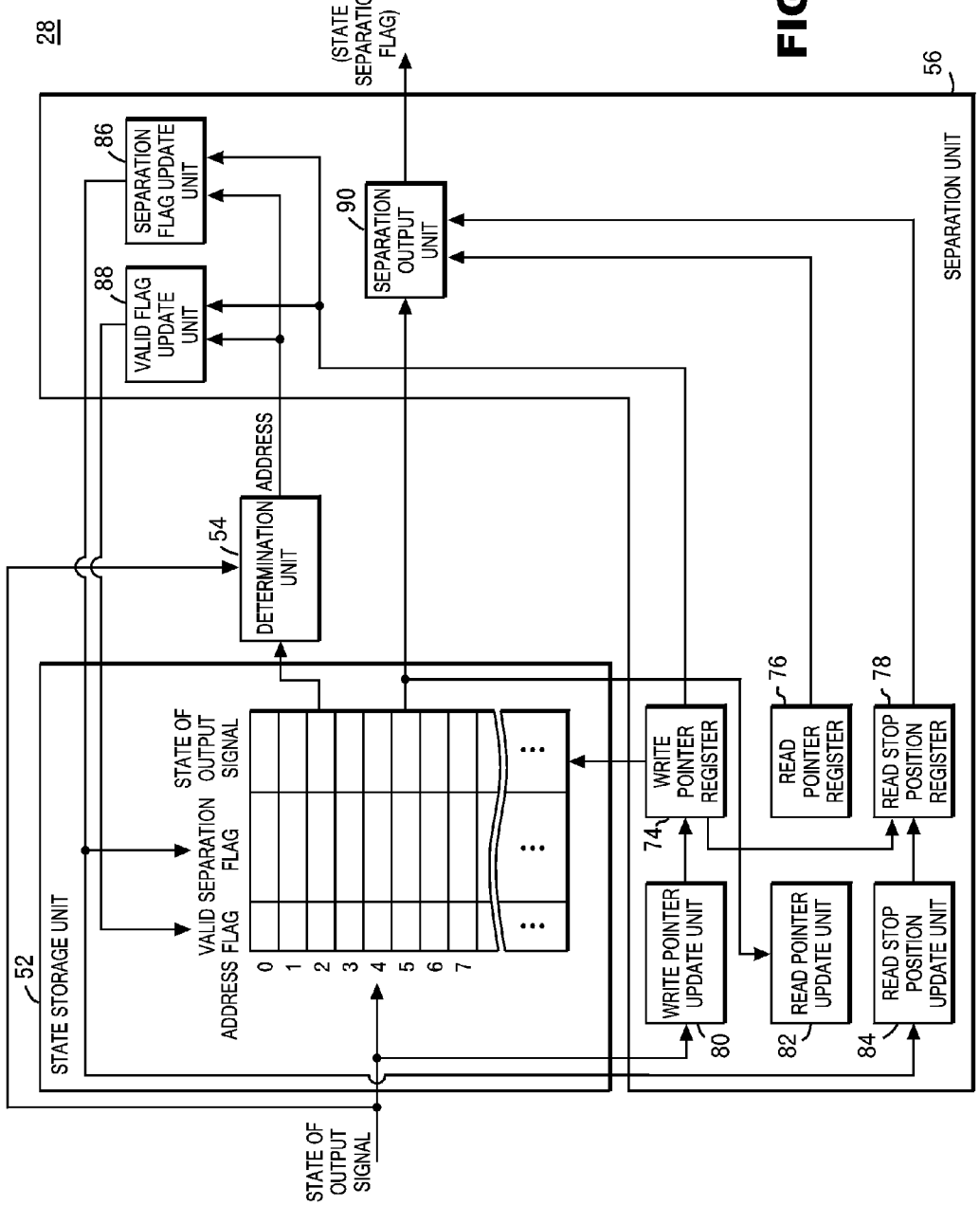
FIG. 2 shows an example of a configuration of a transaction processing unit 28 according to the embodiment of the present invention.

FIG. 2 shows an example of a configuration of the transaction processing unit 28 according to this embodiment. In this embodiment, the state storage unit 52 has a storage area in which addresses of consecutive numbers are assigned. States (signal values) of a plurality of output signals arranged in time series are sequentially inputted to the state storage unit 52. In this embodiment, when a state of one output signal is inputted, the state storage unit 52 stores the inputted state at an address indicated by a write pointer.

The state storage unit 52 may store a separation flag by associating the flag with a state (signal value) of an output signal, the flag indicating whether the state (signal value) is positioned at a boundary where transactions are separated. In this embodiment, in a case where a state of a corresponding output signal is positioned at a boundary, the separation flag is set to valid (1). In a case where a state of a corresponding output signal is not positioned at a boundary, the separation flag is set to invalid (0). Moreover, the state storage unit 52 may store a valid flag in way that the valid flag is associated with a state (signal value) of an output signal, the valid flag indicating whether the state (signal value) is a target to be determined by the determination unit 54. In this embodiment, in a case where a state of a corresponding output signal is a target to be determined, the valid flag is set to valid (1). In a case where a state of a corresponding output signal state is not a target to be determined, the valid flag is set to invalid (0).

Every time when a state of a new output signal is inputted to the state storage unit 52, the determination unit 54 searches one or a plurality of states of the past output signals stored in the state storage unit 52, and determines whether a state of an output signal, which is the same as the state of the new output signal, is stored therein. Then, in a case where the determination unit 54 determines that a state (second signal value) of the past output signal, which is the same as the state (first signal value) of the new output signal, is stored in the state storage unit 52, the determination unit 54 outputs an address number at which the second signal value is stored.

Incidentally, in this case, the determination unit 54 may determine whether there is a state (signal value), which is the same as the state (signal value) of the new output signal, among states (signal values) of output signals each of which indicates that a corresponding valid flag is valid. This limits a search range, thereby making it possible to output a determination result at high speed. The state storage unit 52 and determination unit 54 according to this embodiment can be realized by CAM (Contents Addressing Memory).

The separation unit 56 according to the this embodiment may include a write pointer register 74, a read pointer register 76, a read stop position register 78, a write pointer update unit 80, a read pointer update unit 82, a read stop position update unit 84, a separation flag update unit 86, a valid flag update unit 88, and a separation output unit 90.

The write pointer register 74 stores a write pointer indicating an address of the state storage unit 52, at which a state of an output signal acquired next is written. The read pointer register 76 stores a read pointer indicating an address of the state storage unit 52, at which a state of an output signal read next is read. The read stop position register 78 stores a read stop position indicating an address of the state storage unit 52, at which the reading of states of output signals is stopped.

The write pointer update unit 80 updates a write pointer in the write pointer register 74. The write pointer update unit 80 sets the value of the write pointer at an initial value (for example, 0) of the address at the time of starting an operation of the observation apparatus 20, increments the value of the write pointer every time when one state of an output signal is inputted, and resets the value of the write pointer at the initial value when the value of the write pointer exceeds the maximum address of the state storage unit 52.

The read pointer update unit 82 updates a read pointer in the read pointer register 76. The read pointer update unit 82 sets the value of the read pointer at an initial value of the address at the time of starting an operation of the observation apparatus 20, increments the value of the read pointer every time when one state of an output signal is read, and resets the value of the read pointer at the initial value when the value of the read pointer exceeds the maximum address of the state storage unit 52.

The read stop position update unit 84 updates a read stop position in the read stop position register 78. The read stop position update unit 84 sets the read stop position at an initial value of an address at the time of starting an operation of the observation apparatus 20. In a case where a separation flag is updated, the read stop position update unit 84 changes the read stop position to an address of the updated separation flag.

On condition that it is determined that the first signal value newly obtained is identical with the second signal value, which has been acquired prior to the first signal value, and which has been stored in the state storage unit 52, the separation flag update unit 86 updates a separation flag, which corresponds to the first signal value and the second signal value, to a value indicating a boundary of transactions. As one example, the separation flag update unit 86 may change a separation flag, which corresponds to the address number (address at which the second signal value is stored) outputted by the determination unit 54, and a separation flag, which corresponds to the address (address at which the newly inputted first signal value is stored) indicated by the write pointer, to a value (valid (1)) indicating a boundary of transactions.

On condition that it is determined that the first signal value and the second signal value are identical with each other, the valid flag update unit 88 updates the valid flags, which are stored in the state storage unit 52, and which are associated with the respective signal values from the second signal value to the signal value immediately before the first signal value, so that the valid flags are invalid. As one example, the valid flag update unit 88 may change the valid flags, which correspond to the respective addresses including from the address number (address at which the second signal value is stored) outputted by the determination unit 54 to the address immediately before the address indicated by the write pointer (immediately before the address at which the first signal value newly inputted is stored), so that the valid flags become invalid (0) from valid (1).

The separation output unit 90 sequentially outputs the respective plurality of states (signal values) stored in the state storage unit 52 together with the corresponding separation flags. As one example, the separation output unit 90 reads a state of an output signal and a separation flag from an address indicated by the read pointer in the state storage unit 52, and outputs both results together. Since the value of the read pointer is sequentially incremented in accordance with outputs of states of output signals, the separation output unit 90 sequentially outputs the states of the output signals and the separation flags in time series. Then, when the read pointer and the read stop position coincide with each other, the separation output unit 90 stops the outputting of states of output signals and separation flags.

The aforementioned transaction processing unit 28 makes it possible to sequentially output states of output signals together with separation flags indicating boundaries of transactions. Thus, the transaction processing unit 28 makes it possible to output output signals separated for each transaction.

Incidentally, on condition that it is determined that the first signal value and the second signal value are identical with each other, and that the number of consecutive signal values acquired between the first signal value and the second signal value exceeds a predetermined reference number, the separation unit 56 may separate the signal sequence as a transaction and output the result. This makes it possible to prevent the outputting of an extremely short transaction, which is not more than the predetermined reference number.

Figure 3:
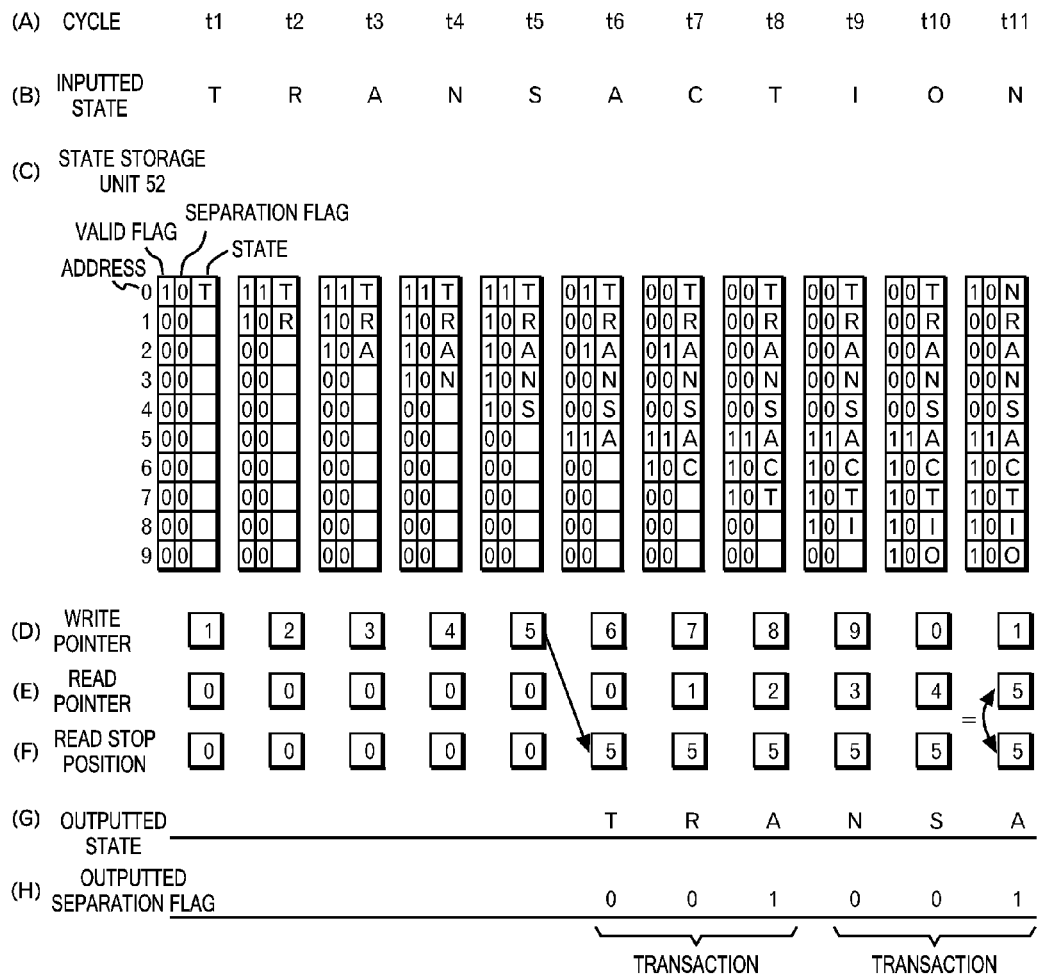
FIG. 3 shows an example of operations of the transaction processing unit 28 shown in FIG. 2.

FIG. 3 shows one example of operations of the transaction processing unit 28 shown in FIG. 2. In FIG. 3, states expressed by 11 characters, i.e., T–>R–>A–>N–>S–>A–>C–>T–>I–>O–>N are sequentially inputted to the transaction processing unit 28 on a cycle-to-cycle basis during cycles t1 to t11. FIG. 3A shows cycles (t1 to t10) at which the state storage unit 52 stores states. FIG. 3B shows states inputted to the state storage unit 52. FIG. 3C shows states and flags stored in the state storage unit 52. FIG. 3D shows values of the write pointer. FIG. 3E shows values of the read pointer. FIG. 3F shows values of the read stop positions. FIG. 3G shows states to be outputted. FIG. 3H shows separation flags to be outputted.

Before cycle t1, the state storage unit 52 does not store any state, and the separation flags and valid flags for the respective addresses are invalid. In addition, the values of the write pointer, the read pointer, and the read stop position are set to 0 for the respective addresses.

At cycle t1, a state "T" is inputted to the state storage unit 52. The state storage unit 52 writes the inputted state "T" at an address 0 indicated by the write pointer, and sets the valid flag, which corresponds to the address 0, as valid (1). The write pointer update unit 80 increments the value of the write pointer.

At subsequent cycles t2 to t5, states "R", "A", "N" and "S" are sequentially inputted to the state storage unit 52. The state storage unit 52 sequentially stores the inputted states "R", "A", "N" and "S" respectively at addresses 1, 2, 3 and 4, and sets the valid flags, which respectively correspond to the inputted states "R", "A", "N" and "S", as valid (1). The write pointer update unit 80 sequentially increments the value of the write pointer.

At cycles t2 to t5, every time when the states "R", "A", "N" and "S" are sequentially inputted, the determination unit 54 determines whether the same state as the inputted state is included in the states which are stored in the state storage unit 52 and whose valid flags are set to valid (1). As a result of determination, since the same state is not stored during cycles t2 to t5, the determination unit 54 does not output an address number.

At cycles t2 to t5, since no address number is outputted from the determination unit 54, the separation flag update unit 86 and the valid flag update unit 88 do not update the separation flags and the valid flags. Moreover, since the separation flags are not updated, the read stop position update unit 84 does not update the read stop position. Since the read pointer and the read stop position coincide with each other, the separation output unit 90 does not output the states stored in the state storage unit 52.

Next, at cycle t6, state "A" is inputted to the state storage unit 52. The state storage unit 52 writes the inputted state "A" at address 5 indicated by the write pointer, and sets the valid flag, which corresponds to the address 5, as valid (1). When the state "A" is inputted, the determination unit 54 determines whether the same state as the inputted state "A" is included in the states which are stored in the state storage unit 52 and whose valid flags are set to valid (1).

Here, at cycle t6, the state storage unit 52 stores state "A" at an address 2 where the valid flag is set to valid (1). Accordingly, the determination unit 54 outputs a number indicating the address 2. In response to the outputting of the number indicating address 2, the separation flag update unit 86 sets the separation flag, which corresponds to the address (address 5) at which the inputted state is written, and the separation flag, which corresponds to the address (address 2) at which the same state as the inputted state is stored, to valid (1). Furthermore, the valid flag update unit 88 sets the valid flags, which correspond to the addresses (addresses 0 to 4) of the states stored before this, to invalid (0).

At cycle t6, since the separation flag is updated, the read stop position update unit 84 updates the read stop position to an address 5 pointed by the write pointer. Since the read stop position is updated, the read pointer and the read stop position do not coincide with each other. Accordingly, the separation output unit 90 starts reading the states stored in the state storage unit 52. At cycle t6, the separation output unit 90 reads the state "T" and the separation flag (invalid (0)) from the address 0 pointed by the read pointer, and outputs the result.

At subsequent cycles t7 to t11, the state storage unit 52 sequentially inputs states "C", "T", "I", "O" and "N". The state storage unit 52 sequentially stores the inputted states "C", "T", "I", "O" and "N" respectively at addresses 6, 7, 8, 9 and 0, and sets the valid flags, which respectively correspond to the inputted states "C", "T", "I", "O" and "N", to valid (1).

At cycles t7 to t11, since the same states as the inputted states are not stored in the range where the valid flags are set to valid (1), the determination unit 54 does not output address numbers. Then, the separation flag update unit 86 and the valid flag update unit 88 do not update the separation flag and the valid flag. The read stop position update unit 84 does not update the read stop position.

At cycles t7 to t11, the read pointer update unit 82 sequentially increments the value of the read pointer. Then, the separation output unit 90 reads the states "R", "A", "N", "S" and "A" respectively at addresses 1, 2, 3, 4, and 5 pointed by the read pointer, and outputs the result. Concurrently, the separation output unit 90 reads the corresponding separation flags, and outputs the results. Then, at cycle t11, since the read pointer and the read stop position coincide with each other, the separation output unit 90 stops reading.

The aforementioned transaction processing unit 28 makes it possible to sequentially output the plurality of states stored in the state storage unit 52 and their corresponding flags in real time, respectively. Incidentally, in this embodiment, the separation flag is output with the state "A," however, the state "A" may be included in the previous transaction in time or the later transaction in time.

FIG. 4 shows an example of transactions measured by the first frequency measurement unit 30 according to this embodiment. For every transaction outputted from the transaction processing unit 28, the first frequency measurement unit 30 measures the number of times each of the transaction is outputted, as a transaction frequency.

As one example, the first frequency measurement unit 30 assigns identification information (ID) by type of transaction as shown in FIG.4. Then, the first frequency measurement unit 30 may count the number of occurrence times of transactions outputted from the transaction processing unit 28, and store the count result as a occurrence frequency by associating the count result with a corresponding ID. Incidentally, in the first frequency measurement unit 30, it also serves a purpose that transactions and IDs are associated in advance or that a new ID is generated every time when a new transaction is inputted.

FIG. 5 shows an example of occurrence frequencies of the transactions assigned to the respective IDs in FIG.4. The idle specifying unit 34 may specify a value of an output signal in a case where the output signal is in an idle state, based on a state occurrence frequency measured by the first frequency measurement unit 30. Here, the idle state refers to a state of an output signal in a case where the observation target apparatus 10 does not output valid data. Accordingly, when the observation target apparatus 10 is in a relatively low load state, the frequency at which the idle state occurs increases.

As one example, the idle specifying unit 34 may specify a signal sequence, which is included in the transaction with a maximum transaction frequency, as an idle state of the signals outputted from the observation target apparatus 10. FIG. 5 is an example showing top-ten occurrence frequencies of the transactions of PCI (Peripheral Component Interconnect) signals. In the case of FIG. 5, occurrence frequencies of transactions of ID=01 and ID=02 are greater than occurrence of frequencies of other transactions by an order of magnitude. Accordingly, in a case where the result as shown in FIG. 5 is obtained, the idle specifying unit 34 may specify the transactions assigned to ID=01 and ID=02 as idle states. This enables the observation apparatus 20 to specify a value indicating an idle state even in a case where an unknown protocol signal is observed.

Incidentally, the idle specifying unit 34 may specify a signal sequence, which is included in the transaction whose frequency is equal to or higher than a reference frequency, as the idle state of the signals outputted from the observation target apparatus 10. Moreover, in place of specifying a value of an idle state for each transaction, the idle specifying unit 34 may specify a value of an output signal in a case where the output signal is in an idle state, based on the occurrence frequency of the output signal value measured by the second frequency measurement unit 32.

Figure 6:
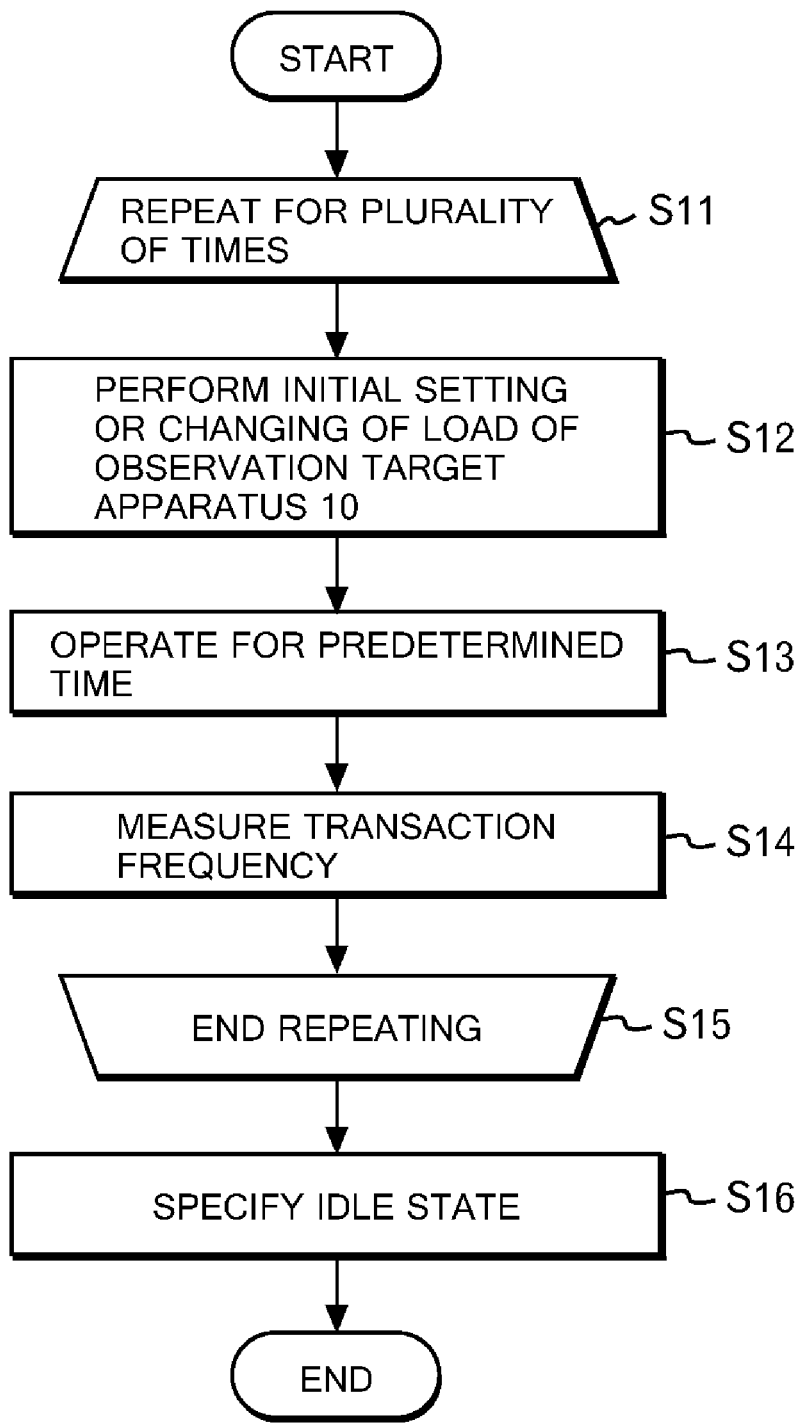
FIG. 6 is a flowchart showing an example of processing for specifying an idle state by the observation apparatus 20 by changing a load of the observation target apparatus 10.

FIG. 6 is a flowchart showing an example of processing for specifying an idle state by the observation apparatus 20 by changing a load of the observation target apparatus 10. When processing for specifying an idle state is started, observations in Steps S12 to S14 are repeatedly performed on the observation target apparatus 10 for a plurality of times (Step S11, S15).

During an observation at each time, the control unit 38 first sets a load of the observation target apparatus 10 (S12). More specifically, the control unit 38 sets the load of the observation target apparatus 10 to an initial value at a first observation time, and changes the load to a value different from those at other times at second and following observation times. Next, the control unit 38 causes the observation target apparatus 10 to operate with the set load for a predetermined period of time (S13). This enables the control unit 38 to cause the observation target apparatus 10 to operate for a plurality of times while changing the operation load of the observation target apparatus 10. Then, during the operation of the observation target apparatus 10, the first frequency measurement unit 30 measures, for each transaction outputted from the separation unit 56, the number of times the transaction is outputted, as a transaction frequency (S14).

When a plurality of observations are completed, the idle specifying unit 34 next specifies a value indicating an idle state, based on the transaction frequency measured for each load (S16). As one example, as an idle state of the signals outputted from the observation target apparatus 10, the idle specifying unit 34 may specify a signal sequence included in a transaction which allows a transaction frequency measured in a case where the observation target apparatus is operated with a higher load to be lower than a transaction frequency measured in a case where the observation target apparatus is operated with a lower load, among transactions whose transaction frequencies are measured.

Most of data transmission protocols for logic circuits transmit values indicating an idle state more times as its load decreases. Thus, the observation apparatus 20 can specify an idle state accurately by making comparison among the transaction frequencies measured by changing the operation load as mentioned above.

Figure 7:
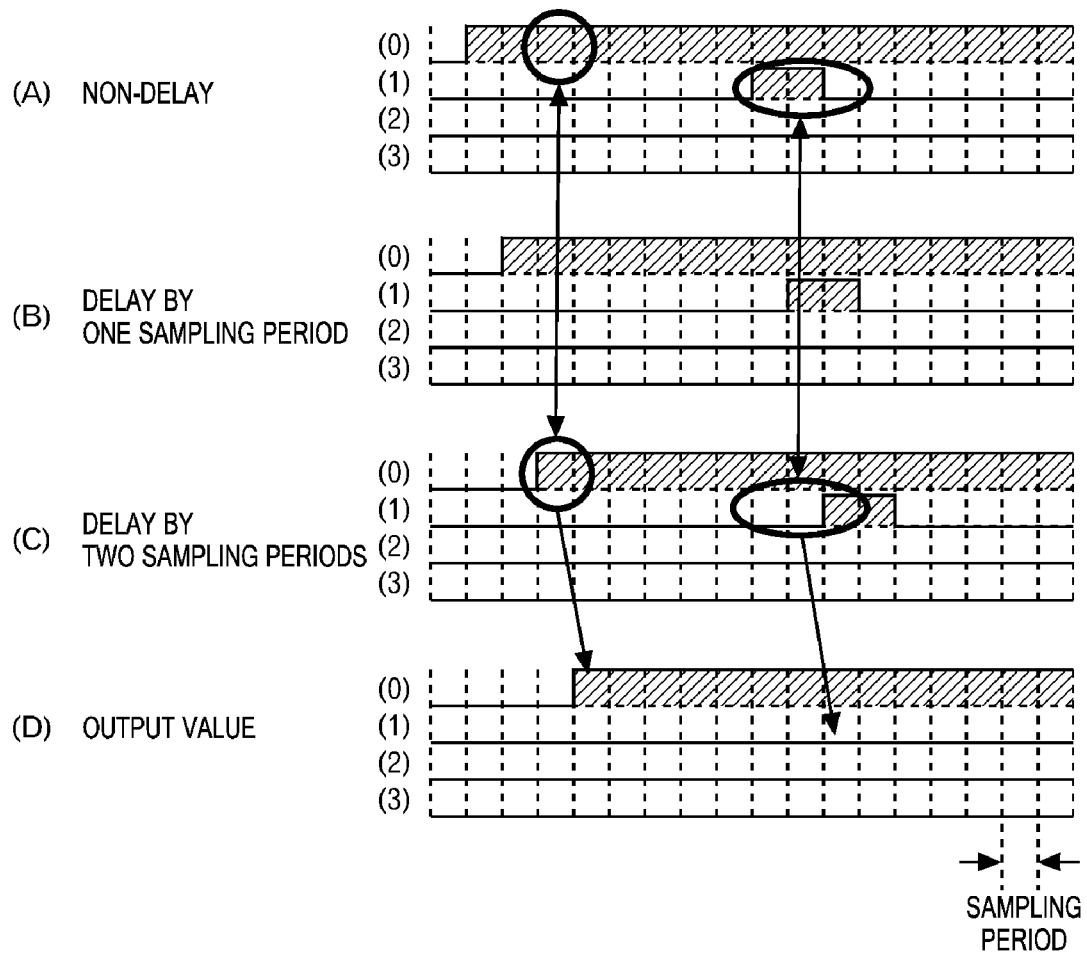
FIG. 7 shows an example of signals inputted to and outputted from a hysteresis processing unit 24, and signals delayed inside the hysteresis processing unit 24.
Figure 8:
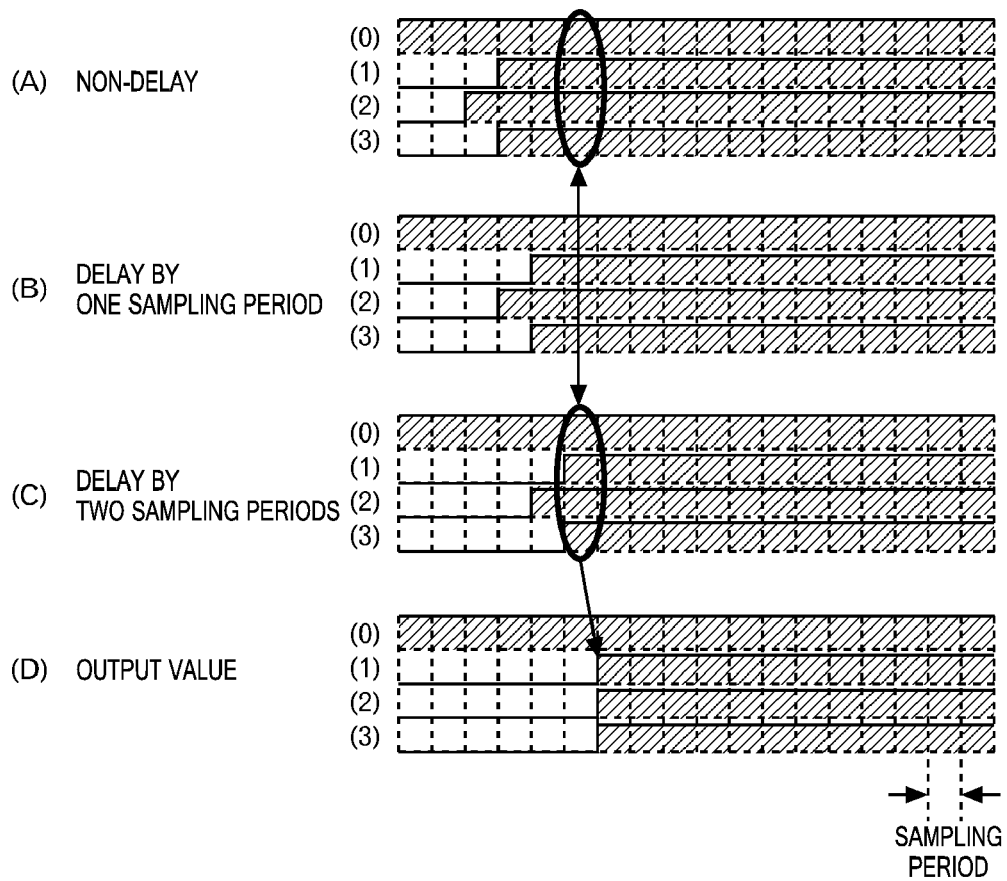
FIG. 8 shows another example of signals inputted to and outputted from the hysteresis processing unit 24, and signals delayed inside the hysteresis processing unit 24.

FIGS. 7 and 8 are examples each showing signals to be inputted to and outputted from the hysteresis processing unit 24, and signals delayed inside the hysteresis processing unit 24. FIGS. 7A and 8A show output signals (non-delay) of the observation target apparatus 10 inputted to the hysteresis processing unit 24. FIGS. 7B and 8B show signals delayed by one sampling period from the signals shown in FIGS. 7A and 8A. FIGS. 7C and 8C show signals delayed by two sampling periods from the signals shown in FIGS. 7A and 8A. FIGS. 7D and 8D show signals outputted from the hysteresis processing unit 24. Moreover, FIGS. 7 and 8 show examples in which the output signals of the observation target apparatus 10 are four-bit parallel signals.

The output signal acquisition unit 22 may acquire signal values for a plurality of times for each operation period of signals outputted from the observation target signal 10. Namely, the output signal acquisition unit 22 acquires output signals from the observation target apparatus 10 for a sampling period shorter than an operation period of the output signals outputted from the observation target apparatus 10. The hysteresis processing unit 24 adds hysteresis to the output signals acquired from the output signal acquisition unit 22, and transmits the resultant signals to the circuit of the subsequent stage to thereby remove a minute bit change from the output signals acquired from the output signal acquisition unit 22.

As one example, the hysteresis processing unit 24 may remove bit value changes, on condition that equal bit values are not detected for a predetermined number of times for each bit of the signals outputted from the observation target apparatus 10 as shown in, for example, FIG. 7. In the example shown in FIG.7, the hysteresis processing unit 24 is configured not to change output values if the input signal (non-delay), the signal delayed by one sampling period, and the signal delayed by two sampling periods are not the same at certain timing for each bit.

In other words, the hysteresis processing unit 24 changes the output value of the bit if an arbitrary bit of the inputted signal changes and then its value is unchanged for a predetermined number of consecutive sampling periods (for example, three). On the other hand, the hysteresis processing unit 24 does not change the output value of the bit if an arbitrary bit of the inputted signal changes and then its value returns to an original value in periods shorter than a predetermined number of sampling periods (for example, three). This enables the hysteresis processing unit 24 to remove noise included in the acquired output signals.

In place of the above, as shown in FIG. 8 for example, the hysteresis processing unit 24 may remove a change in value of each bit, on condition that equal bit values are not detected for a predetermined number of times regarding at least one bit of the signal outputted from the observation target apparatus 10. In the example shown in FIG.8, the hysteresis processing unit 24 is configured not to change the output value if the input signal, the signal delayed by one sampling period, and the signal delayed by two sampling periods are not the same at certain timing.

In other words, the hysteresis processing unit 24 changes the output value of the bit if an input value changes and then its value is unchanged for a predetermined number of consecutive sampling periods (for example, three). On the other hand, the hysteresis processing unit 24 does not change the output value if an input value changes and then its value returns to an original value or changes to another signal value in periods shorter than a predetermined number of sampling periods (for example, three). Accordingly, in a case where the output signals are transmitted through parallel signal lines, the hysteresis processing unit 24 can remove shift of timing between the signal lines and remove noise.

Figure 9:
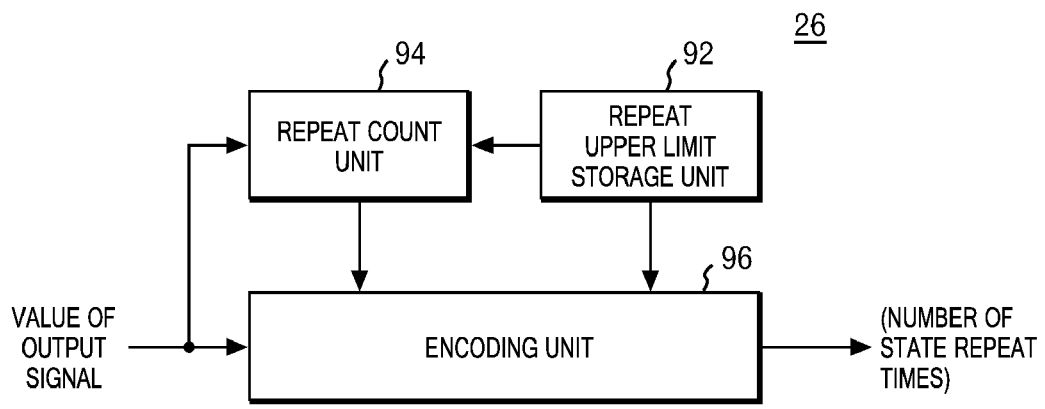
FIG. 9 shows an example of a configuration of a run length processing unit 26 according to the embodiment of the present invention.

FIG. 9 shows an example of a configuration of the run length processing unit 26 according to this embodiment. The run length processing unit 26 may include a repeat upper limit storage unit 92, a repeat count unit 94, and an encoding unit 96. The repeat upper limit storage unit 92 stores the upper limit number of times, which is an upper limit value of the number of repeat times. According as equal signal values are consecutively acquired from the observation target apparatus 10, the repeat count unit 94 counts the number of times the equal signal values are consecutively acquired, as the number of repeat times. In addition to this, the repeat count unit 94 may reset the number of repeat times according as the number of repeat times reaches the upper limit number of times stored in the repeat upper limit storage unit 92.

According as equal signal values are consecutively acquired, the encoding unit 96 encodes values, which indicate that the signal values are continued for the number of repeat times, into one value, and supplies the result to the state storage unit 52. Namely, in a case where equal values are continued with respect to the output signals, the encoding unit 96 encodes these consecutive same values into one state expressed by a pair of a value and a repeated number (number of repeat times). In a case where equal values of the output signals are not continued, the encoding unit 96 may encode the value as one state or encode the value and the number of repeat times showing one repeat time as one state.

In addition to this, according as equal signals are consecutively acquired up to the upper limit number of times, the encoding unit 96 may encode values, which indicate that the signal values are continued up to the upper limit number of times stored in the repeat upper limit storage unit 92, into one value, and supply the result to the state storage unit 52.

The observation apparatus 20 can process the states, which indicate that the values are continued for the number of repeat times, as one state, thereby making it possible to separate a part, in which equal values of the output signals are continued, as one transaction. Moreover, the repeat upper limit storage unit 92 stores the upper limit number of times, so that the run length processing unit 26 can set the upper limit to the number of repeat times encoded to one state.

Figure 10:
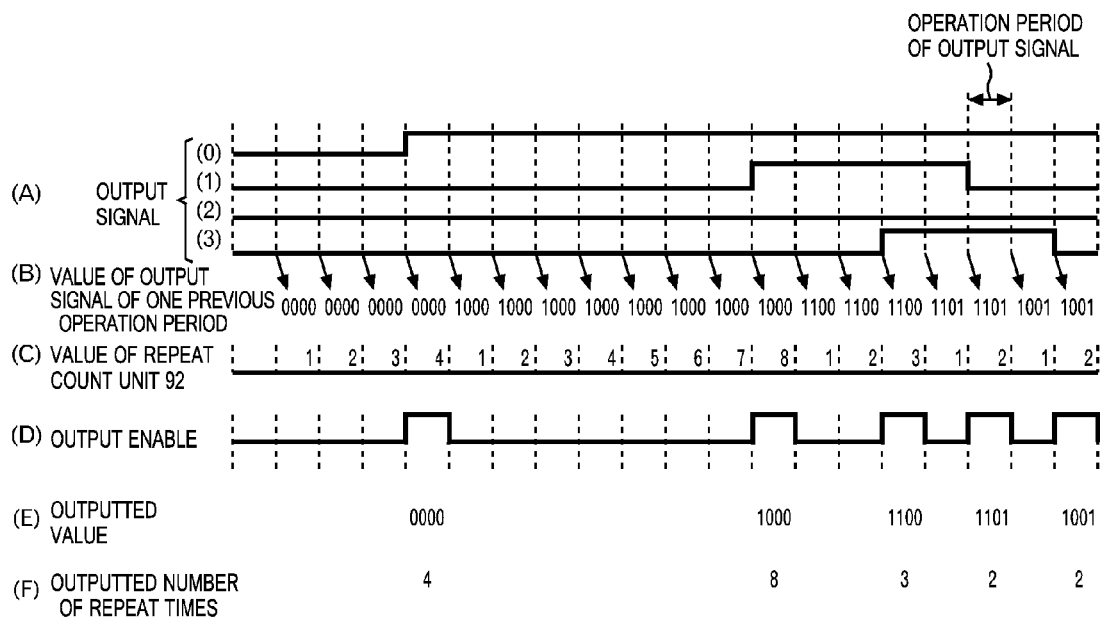
FIG. 10 is a timing chart showing an example of operations of the run length processing unit 26.

FIG. 10 is a timing chart showing an example of operations of the run length processing 26. FIG. 10A shows output signals of, for example, four bits acquired by the output signal acquisition unit 22. FIG. 10B shows a value of an output signal of one previous operation period. FIG. 10C shows a value of the repeat count unit 94. FIG. 10D shows output enable indicating state output timing. FIG. 10E shows values to be outputted. FIG. 10F shows the number of repeat times to be outputted.

The repeat count unit 94 compares the value of the output signal acquired by the output signal acquisition unit 22 with the value of the output signal of one previous operation period as shown in FIGS. 10A to 10C. Then, the repeat count unit 94 increments the value stored therein in a case where no change occurs, and the repeat count unit 94 resets the value stored therein in a case where a change occurs. Moreover, the repeat count unit 94 may regard the output enable as H logic in a case where changes occur as shown in FIG. 10D.

The encoding unit 96 outputs a pair of the values as one state as shown in FIGS. 10E and 10F, the pairs being the output signal at timing when the output enable is regarded as H logic and the number of repeat times counted by the repeat count unit 94. As mentioned above, the run length processing unit 26 can encode the output signals acquired by the output signal acquisition unit 22 into one state expressed by the pair of the values and the repeated number (the number of repeat times) in real time.

Figure 11:
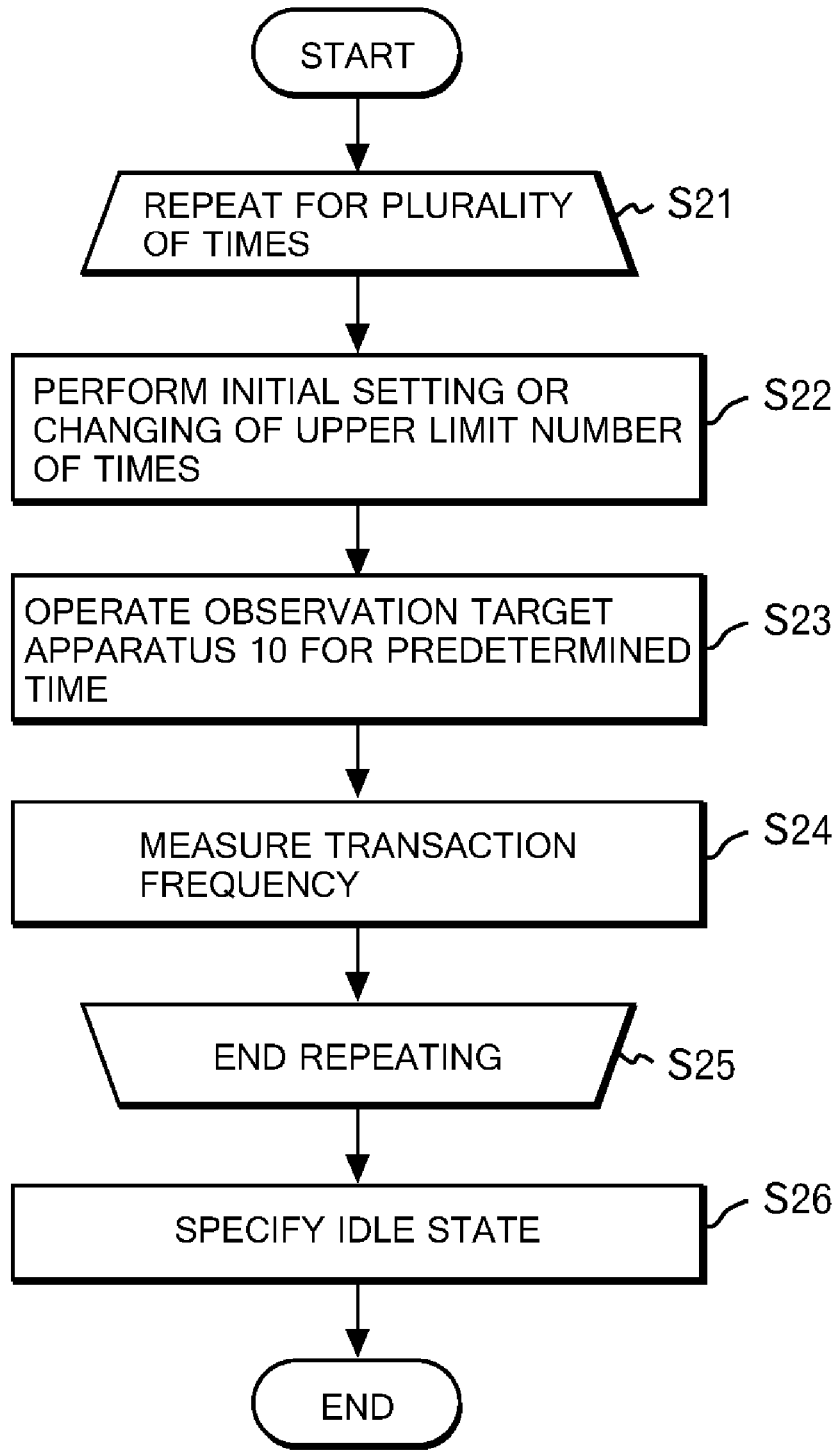
FIG. 11 is a flowchart showing an example of processing for changing the upper limit number of times of the run length processing unit 26 to specify the idle state by the observation apparition 20.

FIG. 11 is a flowchart showing one example of processing for specifying an idle state by the observation apparatus 20 by changing the upper limit number of times of the run length processing unit 26. When processing for specifying an idle state is started, observations are repeatedly performed on the observation target apparatus 10 in Steps S22 to S24 for a plurality of times (Step S21, S25).

During an observation at each time, the control unit 38 first sets the upper limit number of times of the repeat upper limit storage unit 92 in the run length processing unit 26 (S22). More specifically, the control unit 38 sets the upper limit number of times to an initial value at a first observation time, and changes the upper limit number of times to a value different from those at other times at second and following observation times. Next, the control unit 38 causes the observation target apparatus 10 to operate for a predetermined period of time (S23). This enables the control unit 38 to cause the observation target apparatus 10 to operate for a plurality of times while changing the upper limit number of times. Then, during the operation of the observation target apparatus 10, the first frequency measurement unit 30 measures, for each transaction outputted from the separation unit 56, the number of times the transaction is outputted, as a transaction frequency (S24).

When a plurality of observations are completed, the idle specifying unit 34 next specifies a value indicating an idle state, based on the transaction frequency measured for each upper limit number of times (S26). As one example, on condition that a signal sequence, which indicates that common signal values regardless of the upper limit number of times are continued up to the upper limit number of times, is acquired as a transaction with a maximum transaction frequency according as the upper limit number of times is changed, the idle specifying unit 34 may specify the signal sequence, which corresponds to the common signal value, as an idle state of the signals outputted from the observation target apparatus 10. In each case where the upper limit number of times is changed, if the transactions with the maximum frequency are acquired and the common value is included in these acquired transactions, there is a high probability that the common value indicates an idle state. Accordingly, the idle specifying unit 34 can detect an idle state accurately by this processing.

Figure 12:
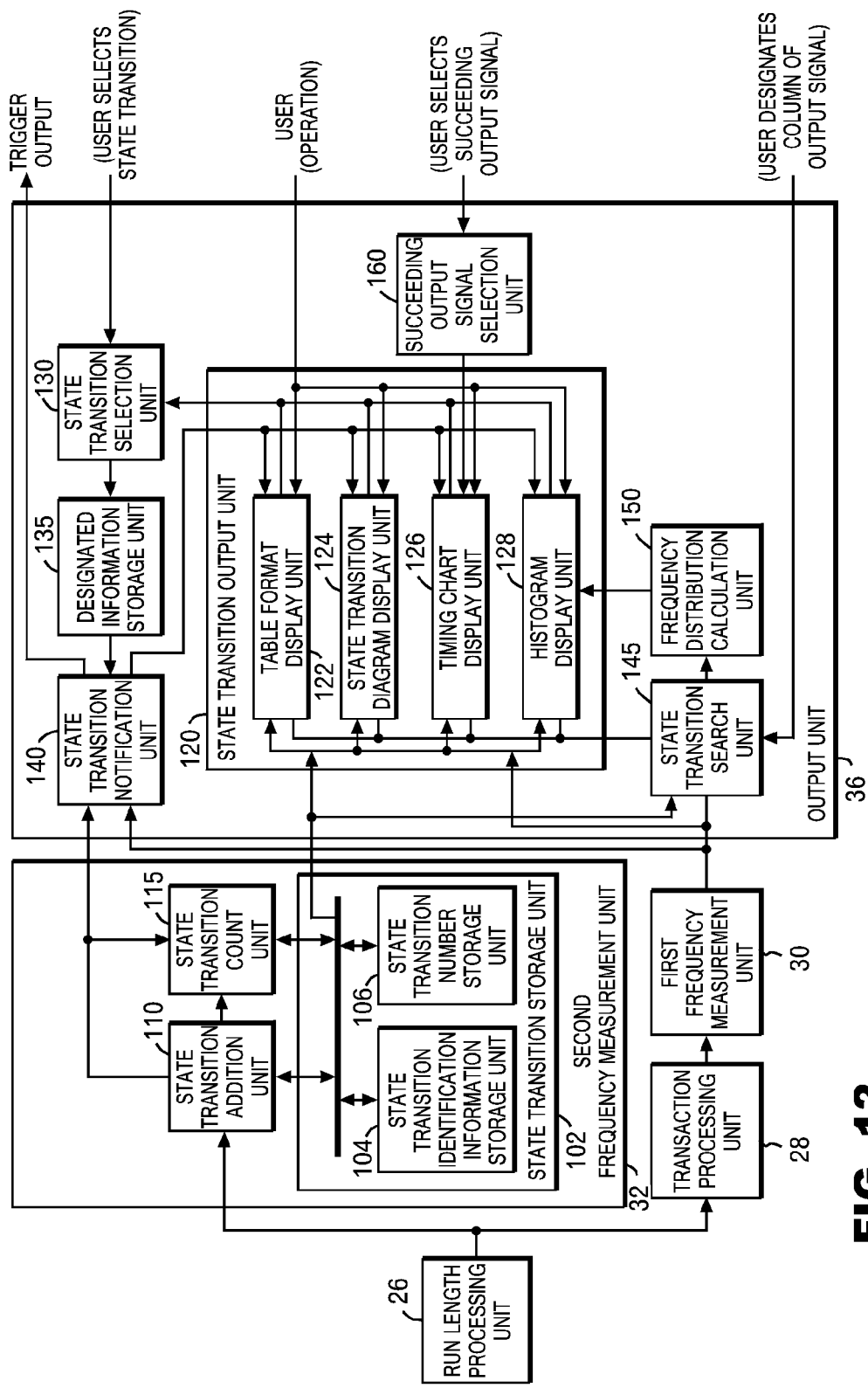
FIG. 12 shows an example of a configuration of a second frequency measurement unit 32 and an output unit 36 together with the run length processing unit 26, the transaction processing unit 28 and the first frequency measurement unit 30 according to the embodiment of the present invention.

FIG. 12 shows an example of a configuration of the second frequency measurement unit 32 and the output unit 36 together with the run length processing unit 26, the transaction processing unit 28 and the first frequency measurement unit 30. As one example, the second frequency measurement unit 32 according to this embodiment may include a state transition storage unit 102, a state transition addition unit 110, and a state transition count unit 115. The state transition storage unit 102 stores a pair of output signals acquired at two or more consecutive cycles as an output signal state transition. States of output signals may be inputted to the state transition storage unit 102 via the run length processing unit 26.

In this embodiment, the state transition storage unit 102 stores a pair of output signals acquired at two or more consecutive cycles as an output signal state transition. For example, in a case where data A is acquired as an output signal at a certain cycle, and data B is acquired as an output signal at a next cycle, the state transition storage unit 102 stores a pair of these output signals (A, B) as a state transition from data A to data B. In other embodiments, the state transition storage unit 102 may use a pair of fixed or variable output signals, which are acquired over many cycles.

The state transition storage unit 102 may include a state transition identification information storage unit 104 and a state transition number storage unit 106. The state transition identification information storage unit 104 stores a pair of output signals and state transition identification information for identifying a state transition corresponding to the pair of output signals by associating the pair of output signals with the state transition identification information. The state transition identification information storage unit 104 is a memory to which, for example, state transition identification information is inputted as an address. The state transition identification information storage unit 104 may store each state transition at an address designated by state transition identification information assigned to the state transition.

The state transition number storage unit 106 stores state transition identification information stored in the state transition identification information storage unit 104 and the number of times a state transition identified by the state transition identification information occurs (the number of occurrence times) by associating these two pieces of information with each other. The state transition number storage unit 106 is a memory to which, for example, state transition identification information is inputted as an address. The state transition number storage unit 106 may store the number of times each state transition occurs at an address designated by state transition identification information assigned to the state transition.

In a case where a state transition, which corresponds to a pair of output signals newly acquired by the output signal acquisition unit 22, is not stored in the state transition storage unit 102, the state transition addition unit 110 adds the pair of newly acquired output signals as a new state transition to the state transition storage unit 102, and causes the state transition storage unit 102 to store it. In a case where the state transition, which corresponds to the pair of output signals newly acquired by the output signal acquisition unit 22, is stored in the state transition storage unit 102, the state transition count unit 115 increments the number of occurrence times of state transitions stored in the state transition storage unit 102 in association with the respective state transitions of output signals.

In this embodiment, states of output signals may be inputted to the first frequency measurement unit 30 via the transaction processing unit 28, and the first frequency measurement unit 30 may carry out the same processing as that of the second frequency measurement unit 32 in this embodiment for each transaction. In this embodiment, as one example, the first frequency measurement unit 30 includes substantially the same functions and configurations as those of the state transition storage unit 102, the state transition addition unit 110, and the state transition count unit 115, so that the explanation thereof except the following differences will be omitted.

In this embodiment, the output unit 36 may include a state transition output unit 120, a state transition selection unit 130, a designated information storage unit 135, a state transition notification unit 140, a state transition search unit 145, a frequency distribution calculation unit 150, and a succeeding output signal selection unit 160.

The state transition output unit 120 outputs state transitions of output signals stored in the state transition storage unit 102. The state transition output unit 120 according to this embodiment displays state transitions of output signals stored in the state transition storage unit 102 to a user of the observation apparatus 20. The state transition output unit 120 includes a table format display unit 122, a state transition diagram display unit 124, a timing chart display unit 126, and a histogram display unit 128.

The table format display unit 122 displays the number of occurrence times of state transitions, each of which corresponds to a pair of an output signal acquired at one cycle and an output signal acquired at a next cycle, in a table format. The state transition diagram display unit 124 displays state transitions of output signals stored in the state transition storage unit 102 as a state transition diagram. The timing chart display unit 126 displays state transitions of output signals stored in the state transition storage unit 102 as a timing chart. The histogram display unit 128 displays a histogram based on the number of occurrence times of state transitions of output signals stored in the state transition storage unit 102.

The state transition selection unit 130 causes the user of the observation apparatus 20 to designate or select at least one state transition. The designated information storage unit 135 stores state transitions designated or selected by the user of the observation apparatus 20. In a case where a state transition, which corresponds to a pair of output signals newly acquired from the output signal acquisition unit 22, meets a predetermined notification condition, the state transition notification unit 140 notifies other observation apparatuses and/or state transition output unit 120 connected to the observation apparatus 20 of occurrence of the state transition which meets the notification condition.

For each state transition whose frequency should be displayed in the histogram, the state transition search unit 145 searches the state transition storage unit 102 for state transitions including the relevant state transition. The frequency distribution calculation unit 150 calculates frequencies of the state transitions to be displayed, based on the number of occurrence times stored in the state transition storage unit 102, the number being associated with the searched state transitions, and supplies the result to the histogram display unit 128.

Regarding the timing chart display, in a case where there are a plurality of candidates of timing charts subsequent to the already-displayed timing chart, the succeeding output signal selection unit 160 causes the user to select the following timing chart.

FIG. 13 shows an example of display in a table format by the observation apparatus 20 according to this embodiment.

The table format display unit 122 in the observation apparatus 20 acquires the number of occurrence times of each state transition, which corresponds to a pair of output signals acquired at two consecutive cycles, from the state transition storage unit 102, and displays the result in a table format. Namely, the table format display unit 122 displays the number of occurrence times of each state transition, which corresponds to a pair of an output signal acquired at one cycle and an output signal acquired at a cycle next to the relevant one cycle, on a corresponding cell of a table, where output signals acquired at one cycle are placed in a row direction, and output signals acquired at the cycle next to the relevant one cycle are placed in a column direction. In place of the above, the table format display unit 122 may display each cell in a state where output signals acquired at one cycle are placed in a column direction, and output signals acquired at the cycle next to the relevant one cycle are placed in a row direction. This enables the user of the observation apparatus 20 to appropriately grasp the number of occurrence times of each state transition.

Moreover, the table format display unit 122 performs display in a display format, in which cells of state transitions occurred more than the predetermined number of times can be distinguished from cells of state transitions occurred less than or equal to the predetermined number of times. Namely, the table format display unit 122 highlights cells of the relevant state transitions which occur many times, for example, by expressing outer frames of the cells with thick line, making a background color of the relevant cells different from that of the other cells, or making a color, a font or a thickness of characters in the relevant cells different from those of the other cells, in terms of the cells which display the state transitions occurred more than the predetermined number of times. This enables the user of the observation apparatus 20 to recognize that the relevant state transitions occur many times without reading the number of occurrence times of the relevant state transitions. Incidentally, in place of the above, the table format display unit 122 may highlight cells which display state transitions occurred less than the predetermined number of times.

Furthermore, the table format display unit 122 may perform display in a display format, in which cells displaying state transitions corresponding to pairs of output signals acquired in the latest predetermined period of time can be distinguished from cells displaying state transitions corresponding to pairs of output signals which are not acquired in the latest predetermined period of time.

Moreover, the state transition selection unit 130 causes the user to select at least one cell, which corresponds to a state transition whose notification should be made by the state transition notification unit 140, out of the respective cells displayed by the table format display unit 122. Then, the state transition selection unit 130 records the relevant state transition in the designated information storage unit 135. As a result, in a case where a state transition, which corresponds to a pair of output signals newly acquired by the output signal acquisition unit 22, coincides with the state transition, which corresponds to the selected cell, the state transition notification unit 140 can make a notification that the state transition coinciding with the selected state transition occurs.

The aforementioned table format display unit 122 can provide a user interface, which clearly displays the state transitions of the output signals of the observation target apparatus 10 in a table format, and which is easily operated by the user.

Incidentally, based on the number of occurrence times of each state transition stored in the state transition storage unit 102, the table format display unit 122 may calculate the number of occurrence times of state transitions at adjacent two cycles in the table format similar to the aforementioned case. For example, in a case where a first state transition (A->B->C->A->B) is counted two times, and a second state transition (D->A->B) is counted three times, a state transition (A->B) occurs two times per one first state transition, and a state transition (A->B) occurs one time per one second state transition. Accordingly, the table format display unit 122 may calculate that the state transition (A->B) occurs seven times in total (2×2+3).

Figure 14:
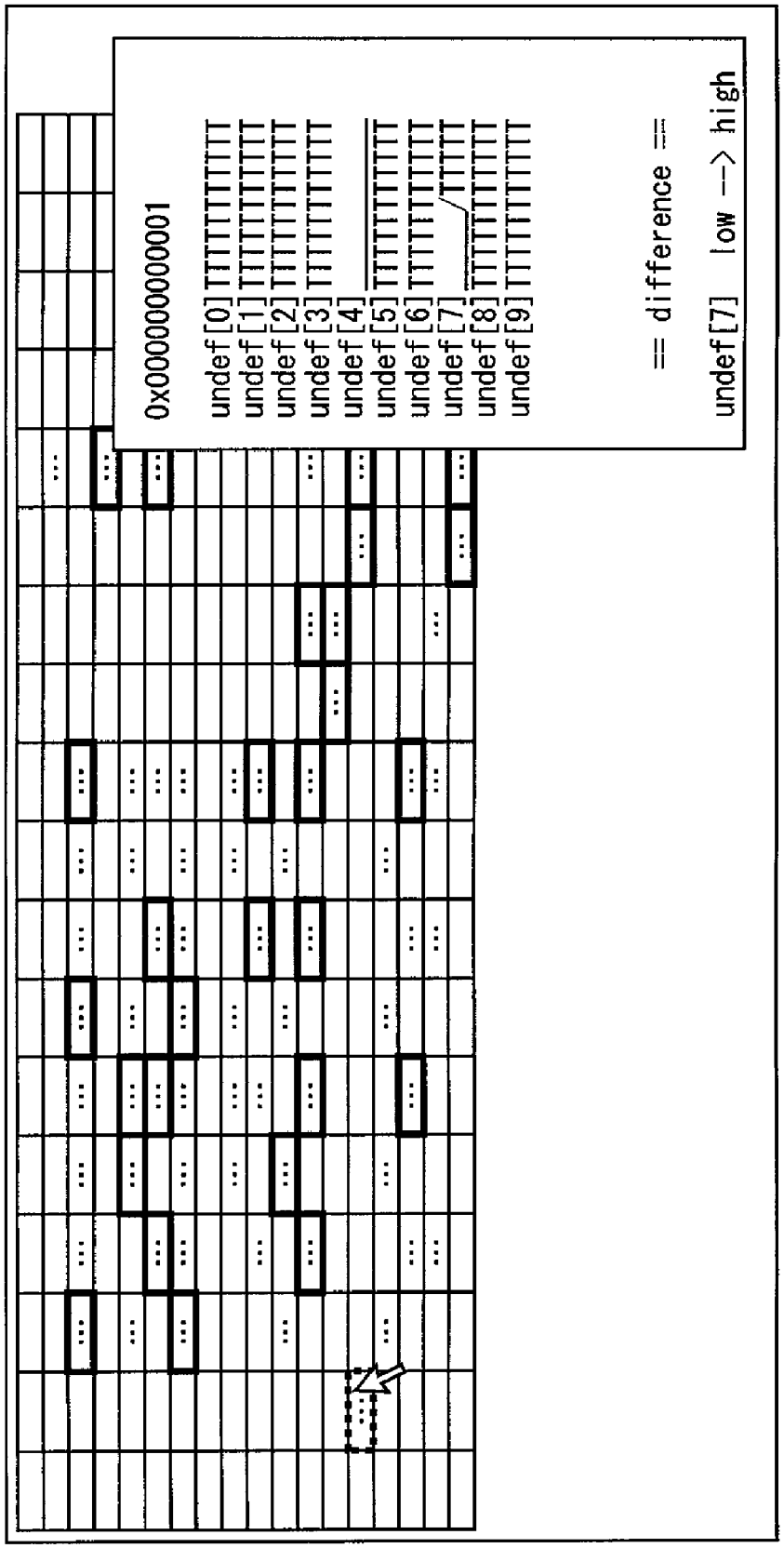
FIG. 14 shows an example in which a timing chart is further displayed on a display in a table format by the observation apparatus 20 according to the embodiment of the present invention.

FIG. 14 shows an example in which a state transition, which corresponds to a certain cell, is further displayed using a timing chart, in the case of display in the table format by the observation apparatus 20 according to this embodiment. In a case where the respective states are displayed in a table format, when one cell is designated by the user, the table format display unit 122 displays a timing chart indicating a change in the output signal in the state transition corresponding to the relevant cell.

This enables the user of the observation apparatus 20 to readily grasp the state transition corresponding to each cell.

Figure 15:
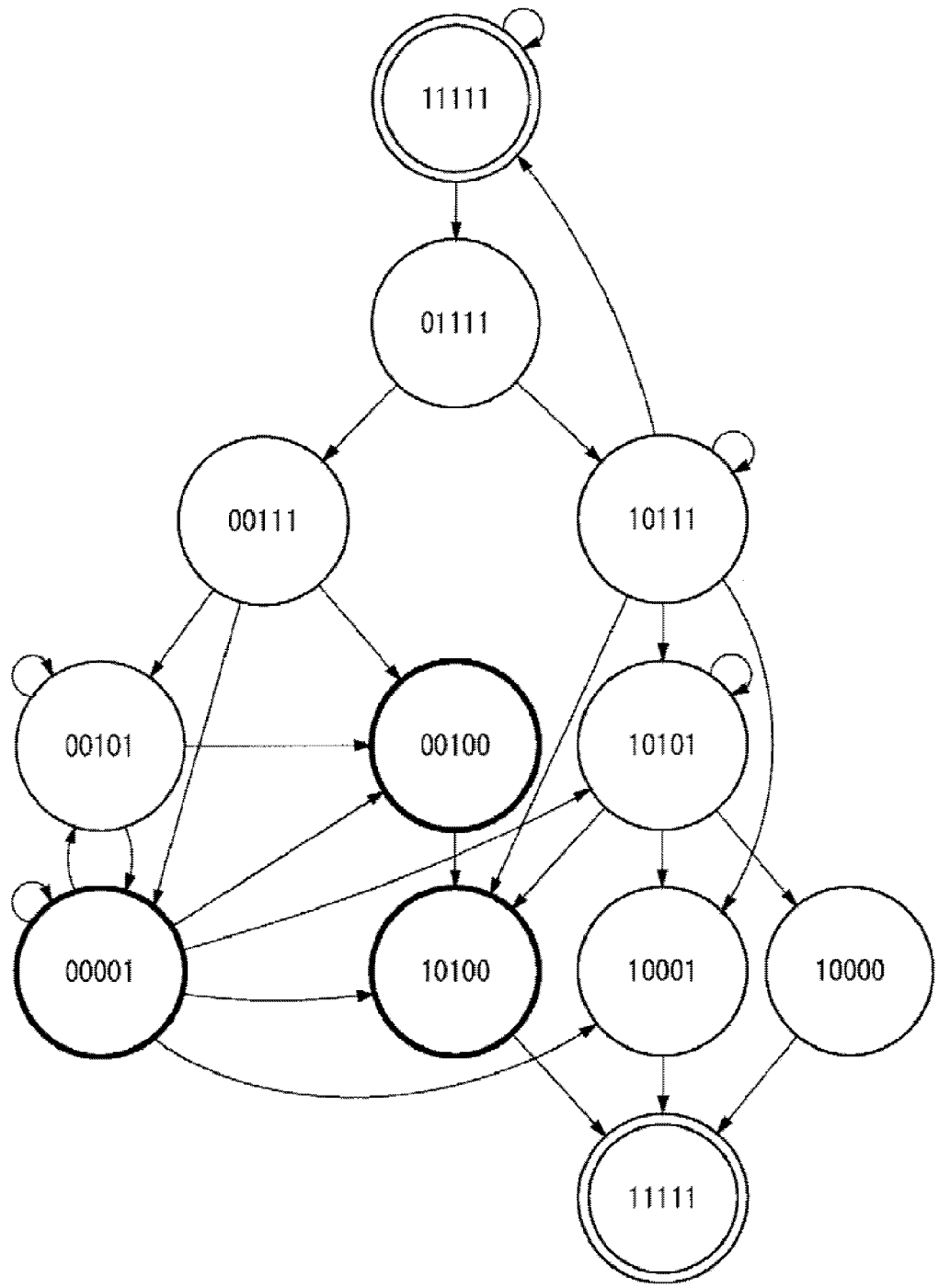
FIG. 15 shows an example of a reduced display of a state transition diagram by the observation apparatus 20 according to the embodiment of the present invention.
Figure 16:
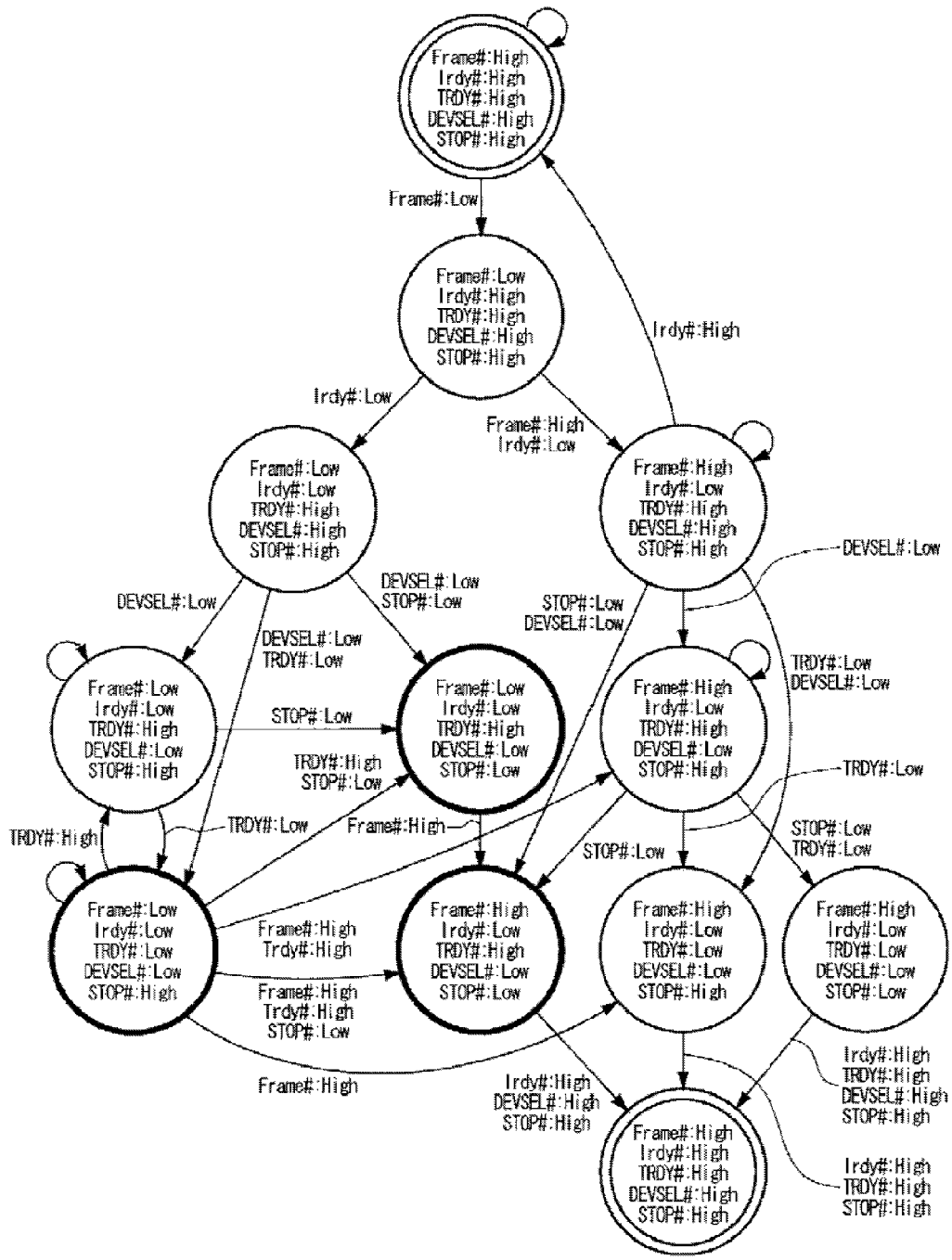
FIG. 16 shows an example of an enlarged display of a state transition diagram by the observation apparatus 20 according to the embodiment of the present invention.

FIGS. 15 and 16 are examples respectively of a reduced display and an enlarged display of a state transition diagram by the observation apparatus 20 according to this embodiment.

The state transition diagram display unit 124 in the observation apparatus 20 displays a state transition, which corresponds to a pair of outputs stored in the state transition storage unit 102, using a state transition diagram. Namely, the state transition diagram display unit 124 displays each of the output signals acquired at each cycle as a node indicating a state of the relevant output signal (circles or double circles in FIGS. 15 and 16). Moreover, the state transition diagram display unit 124 displays a state transition, which corresponds to a pair of output signals acquired at two consecutive cycles, as a link from a node, which indicates the output signal acquired at the first cycle, to a node which indicates the output signal acquired at the second cycle (arrows in FIGS. 15 and 16: arcs).

In a case where state transitions of output signals are acquired for each transaction, the state transition diagram display unit 124 may display nodes corresponding to the head output signal and tail output signal of the transaction to be distinguishable from intermediate nodes. In FIGS. 15 and 16, as one example, the head and tail nodes are illustrated by the double circles, and the intermediate nodes are illustrated by the single circles.

The state transition diagram display unit 124 changes the size of the state transition diagram to be displayed on a screen depending on an instruction from the user. In the case of displaying the state transition diagram with a size less than a predetermined size (reduced display), the state transition diagram display unit 124 displays the respective nodes and links in a display format for reduced display. Namely, for example, the state transition diagram display unit 124 displays data values of the output signals, which correspond to the respective nodes, as binary or hexadecimal values at one time as shown in FIG. 15. Furthermore, the state transition diagram display unit 124 does not display information indicating changed signals corresponding to the respective links.

On the other hand, in the case of displaying the state transition diagram with a size larger than or equal to a predetermined size (enlarged display), the state transition diagram display unit 124 displays the respective nodes and links in a display format for enlarged display. Namely, for example, regarding the output signals corresponding to the respective nodes, the state transition diagram display unit 124 individually displays names and values of the respective bits included in the relevant output signal as shown in FIG. 16. Furthermore, the state transition diagram display unit 124 displays information indicating changed signals corresponding to the respective links.

Here, the state transition diagram display unit 124 performs display in a display format, in which a node, an arc, or a plurality of nodes and one or more pairs of arcs, which display states or state transitions occurred more than the predetermined number of times, can be distinguished from a node, an arc, or a plurality of nodes and one or more pairs of arcs, which display state transitions occurred equal to or less than the predetermined number of times. Namely, for example, the state transition diagram display unit 124 highlights the relevant states or state transitions which occur many times, by expressing outer peripheries of the nodes or the arcs with thick line, or making a color of the relevant nodes or arcs different form that of the other nodes or arcs, in terms of the nodes and arcs which display the states or state transitions occurred more than the predetermined number of times. In place of the above, the state transition diagram display unit 124 may highlight nodes or arcs which display states or state transitions occurred only less than the predetermined number of times.

Furthermore, the state transition diagram display unit 124 may perform display in a display format, in which a node, an arc, or a plurality of nodes and one or more arcs, which display state transitions corresponding to pairs of output signals acquired in the latest predetermined period of time can be distinguished from a node, an arc, or a plurality of nodes and one or more arcs, which display state transitions corresponding to pairs of output signals which are not acquired in the latest predetermined period of time.

Moreover, the state transition selection unit 130 causes the user of the observation apparatus 20 to select at least one link or at least two nodes displayed by the state transition diagram display unit 124. Then, the state transition selection unit 130 records the relevant state transition in the designated information storage unit 135. As a result, in a case where a state transition, which corresponds to a pair of output signals newly acquired by the output signal acquisition unit 22, coincides with the state transition, which corresponds to the selected link or the selected at least two nodes, the state transition notification unit 140 can make a notification that the state transition coinciding with the selected state transition occurs. In this case, the state transition diagram display unit 124 may add a new node and/or arc based on an instruction from the user, and cause the user to select the added node and/or arc.

The aforementioned state transition diagram display unit 124 can provide a user interface, which clearly displays the state transitions of the output signals of the observation target apparatus 10 in a table format, and which is easily operated by the user.

Figure 17:
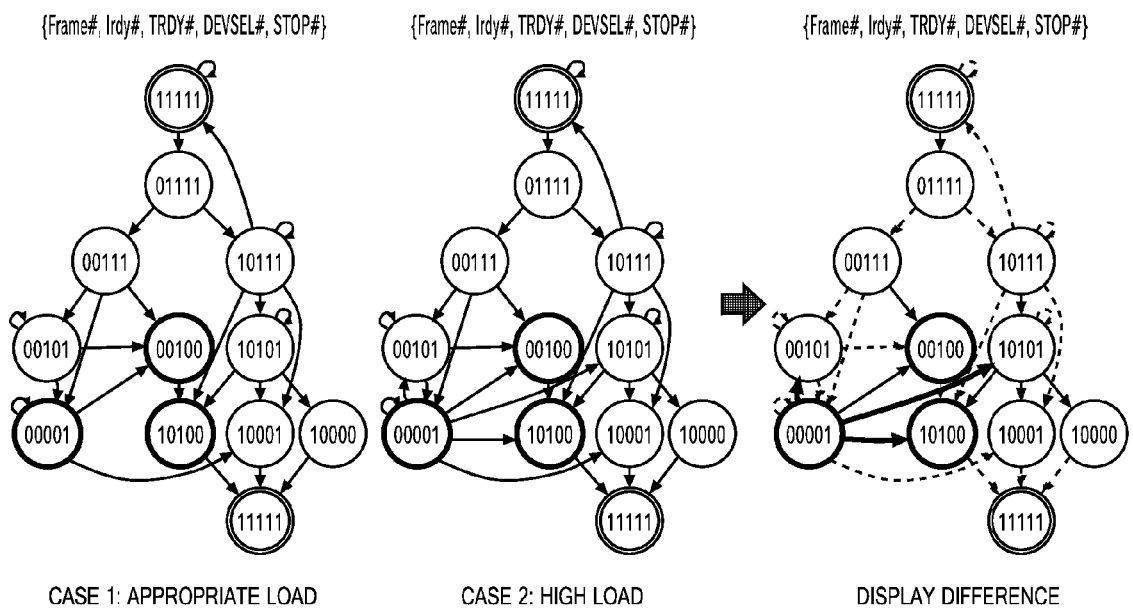
FIG. 17 shows an example of comparison in display of the state transitions by the observation apparatus 20 according to the embodiment of the present invention.

FIG. 17 shows an example of comparison in display of state transitions by the observation apparatus 20 according to this embodiment. The state transition diagram display unit 124 according to this embodiment has a function to compare a plurality of state transition diagrams. Namely, for example, the state transition diagram display unit 124 compares a first state transition diagram acquired as a result of the testing carried out immediately before this time with a second state transition diagram designated by the user of the observation apparatus 20, and displays links which are not included in the second state transition diagram, among links displayed in the first state transition diagram, in a way that the links which are not included in the second state transition diagram can be distinguished from the links included in the second state transition diagram.

In the example shown in FIG. 17, the state transition diagram display unit 124 first generates a second state transition diagram (case 1) based on output signals acquired in a state that an appropriate processing load is added to the observation target apparatus 10, and the generated second state transition diagram is stored in the state transition diagram unit 124. Next, the state transition diagram display unit 124 generates a first state transition diagram (case 2) based on output signals acquired in a state that a high processing load is added to the observation target apparatus 10, and compares the generated first state transition diagram with the second state transition diagram. As a result of this comparison, the state transition diagram display unit 124 highlights links which are not included in the second state transition diagram among links displayed in the first state transition diagram. This comparison enables the state transition diagram display unit 124 to distinguishably display state transitions occurred only in the case of a high load, and to support failure debugging occurred only in the case of a high load.

Incidentally, the state transition diagram display unit 124 may use a state transition diagram generated by the state transition diagram display unit 124 or the like based on the output signals acquired during a normal operation of the observation target apparatus 10, as the second state transition diagram to be compared with the first state transition diagram.

Figure 18:
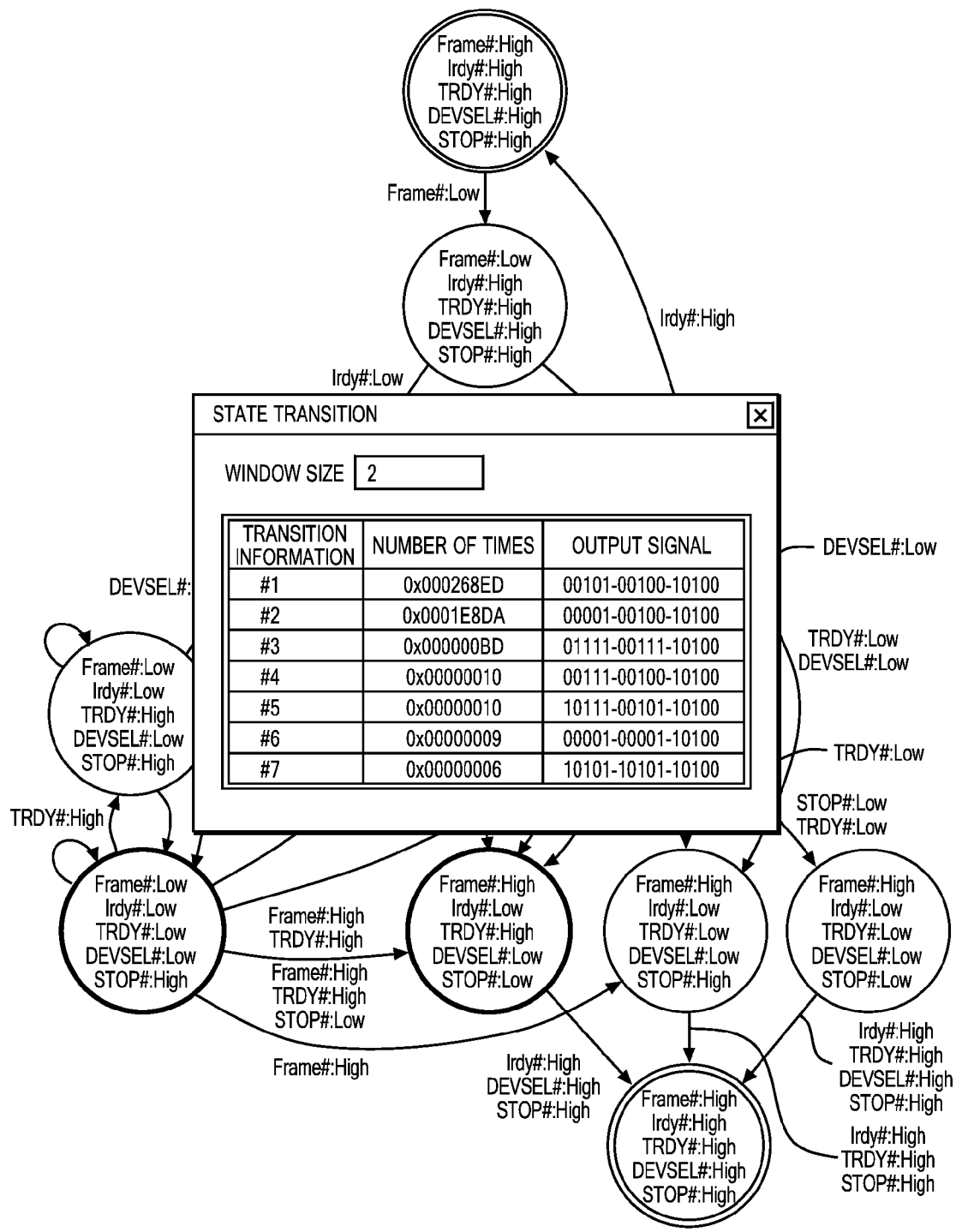
FIG. 18 shows an example of a selection display of state transitions by the observation apparatus 20 according to the embodiment of the present invention.

FIG. 18 shows an example of a selection display of state transitions by the observation apparatus 20 according to this embodiment. When the user selects at least two nodes sequentially, the state transition diagram display unit 124 displays a list of partial state transitions, which pass through these nodes in order, on a pop-up window or the like. In this embodiment, as the list of such state transitions, the state transition diagram display unit 124 displays numbers to respectively identify state transitions, numbers respectively of occurrence times of state transitions, and pairs of output signals. When any one of state transitions is selected on the window which displays the list of state transitions, the state transition diagram display unit 124 distinguishably displays nodes and a pair of links corresponding to the relevant state transition.

The aforementioned state transition diagram display unit 124 makes it possible to appropriately select a partial state transition, which corresponds to a part of the transaction, from the entire state transition diagram.

Figure 19:
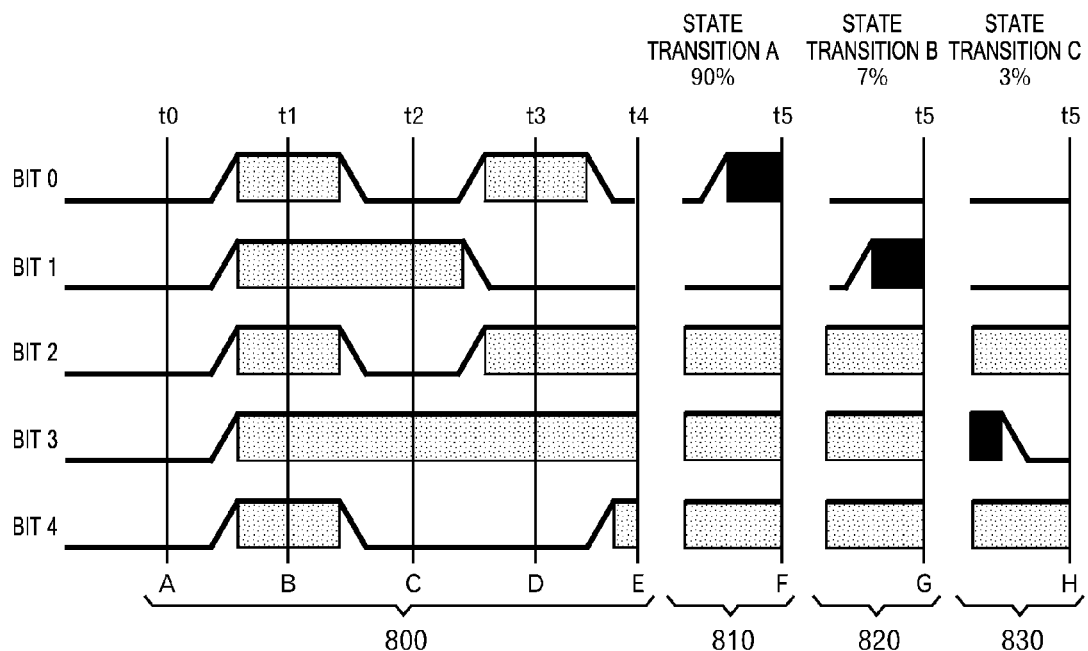
FIG. 19 shows an example of a display of a timing chart by the observation apparatus 20 according to the embodiment of the present invention.

FIG. 19 shows an example of a display of a timing chart by the observation apparatus 20 according to this embodiment.

The timing chart display unit 126 in the observation apparatus 20 displays each state transition stored in the state transition storage unit 102 using a timing chart. Here, in a case where a first pair of output signals and a second pair of output signals, which include one or a plurality of output signals taking the same value as the top output signal, are acquired, the timing chart display unit 126 displays one or a plurality of output signals taking the same value, at least one output signal subsequent to the one or the plurality of output signals in the first pair of output signals, and at least one output signal subsequent to the one or the plurality of output signals in the second pair of output signals, respectively as timing charts.

For example, in a case where a state transition A (A->B->C->D->E->F) which corresponds to a pair A of output signals, a state transition B (A->B->C->D->E->G) which corresponds to a pair B of output signals, and a state transition C (A->B->C->D->E->H) which corresponds to a pair C of output signals are stored in the state transition storage unit 102, one timing chart 800 of the output signals taking the same value (A->B->C->D->E) is displayed. Moreover, a timing chart 810 of an output signal F subsequent to the timing chart 800 in the pair A of output signals, a timing chart 820 of an output signal G subsequent to the timing chart 800 in the pair B of output signals, and a timing chart 830 of an output signal H subsequent to the timing chart 800 in the pair C of output signals are displayed.

The timing chart display unit 126 according to this embodiment arranges the timing charts 800 to 830 of the respective output signals subsequent to the output signal taking the same value in a horizontal direction to be visually recognizable at the same time, and displays these timing charts to enable the user to select a timing chart. Furthermore, the timing chart display unit 126 displays frequencies of the relevant state transitions which occur in accordance with the timing charts 810 to 830 of the respective output signals subsequent to the output signal taking the same value.

Next, the succeeding output signal selection unit 160 causes the user of the observation apparatus 20 to select either at least one succeeding output signal in the first pair of output signals or at least one succeeding output signal in the second pair of output signals. Namely, in this embodiment, the succeeding output signal selection unit 160 causes the user to select any one of the timing charts 810 to 830 to thereby select any one of the output signals F, G or H.

Then, in a case where at least one succeeding output signal in the first pair of output signals is selected, the timing chart display unit 126 displays one or a plurality of output signals taking the same value and at least one output signal in the first pair of the output signals as, for example, one timing chart. Meanwhile, the timing chart display unit 126 erases the display of the timing chart for at least one succeeding output signal in the non-selected second pair of output signals.

On acquisition of the first pair of output signals (for example, A->B->C->D->E->F->X->Y->Z), the second pair of output signals (A->B->C->D->E->G) where n1 (for example, five) output signals from the top output signal take the same value as the value of the first pair of output signals, and the third pair of output signals (for example, A->B->C->D->E->F->X->Y->W) where n2 output signals, n2 being larger than n1 (n2 >n1), from the top output signal take the same value as that of the first pair of output signals, the timing chart display unit 126 may perform the following display.

First, the timing chart display unit 126 displays n1 output signals (A->B->C->D->E), at least one output signal (for example, F) being common to the first pair of output signals and the third pair of output signals and following n1 output signals, and at least one output signal (for example, G) following n1 output signals in the second pair of output signals, respectively as timing charts.

Next, in a case where at least one output signal (for example, F) being common to the first pair of output signals and the third pair of output signals is selected, the timing chart display unit 126 displays n2 output signals (for example, A->B->C->D->E->F->X->Y) being common to the first pair of output signals and the third pair of output signals, at least one output signal (for example, Z) following the first pair of output signals and the third pair of output signals in terms of the first pair of output signals, and at least one output signal (for example, W) following the first pair of output signals and the third pair of output signals in terms of the third pair of output signals. Then, the timing chart display unit 126 causes the user to select any one of the output signals again.

The aforementioned timing chart display unit 126 makes it possible to display the pairs of output signals included in the transactions or the like sequentially from the top using the timing charts. Regarding the respective transactions where already-displayed parts are common to one another, the timing chart display unit 126 makes it possible to display at least one output signal following the already-displayed parts. Then, in a case where any one of the succeeding output signals is selected, the timing chart display unit 126 can perform display again using the timing chart including the selected output signal in the common part. Accordingly, the timing chart display unit 126 sequentially selects the timing charts selectively displayed, thereby making it possible to provide a user interface capable of specifying transactions sequentially from the top.

Figure 20:
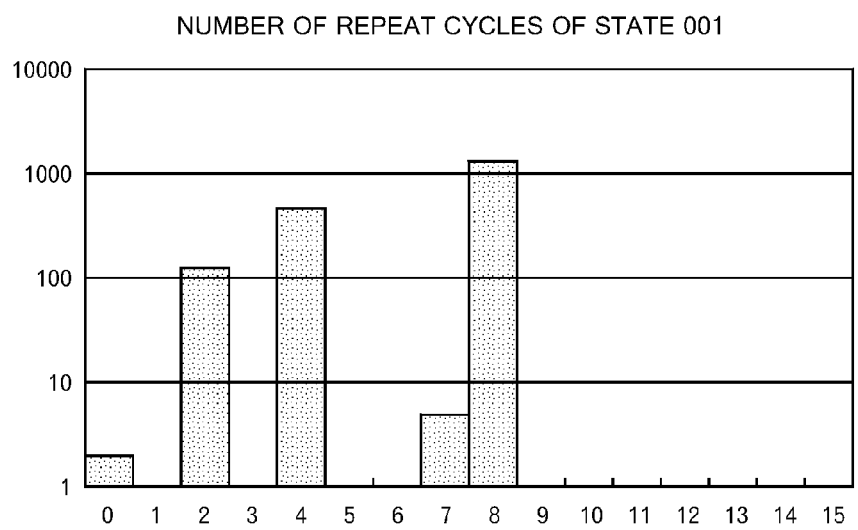
FIG. 20 shows an example of a display of a histogram by the observation apparatus 20 according to the embodiment of the present invention.

FIG. 20 shows an example of a display of a histogram by the observation apparatus 20 according to this embodiment. The histogram display unit 128 in the observation apparatus 20 displays a frequency distribution of the number of sequences of output signals designated by the user, the sequences being consecutively and repeatedly outputted, by use of a histogram. More specifically, first, the state transition search unit 145 searches the state transition identification information storage unit 104 in the state transition storage unit 102 for a state transition, which corresponds to a pair of output signals including the sequence of output signals designated by the user of the observation apparatus 20. Then, the state transition search unit 145 supplies the relevant state transition and the number of occurrence times thereof to the frequency distribution calculation unit 150. Next, the frequency distribution calculation unit 150 calculates the number of sequences of the relevant output signals consecutively included in each state transition searched by the state transition search unit 145. The number of sequences of output signals may be one or a plurality of output signals. For example, the number of sequences (B) of output signals, which are consecutively included in the state transition (A->B->B->B->D), is three. Then, if the number of occurrence times of the relevant state transition is 100, the number of frequencies the relevant sequences (B) of output signals appear is 300.

Next, the frequency distribution calculation unit 150 calculates the frequency distribution of the number of sequences of the relevant output signals to be repeatedly outputted, based on the calculated number and the number of occurrence times of the searched state transition. Namely, the frequency distribution calculation unit 150 divides the number of sequences of the relevant output signals to be repeatedly outputted into classes, and sums up the number of occurrence times for each class to thereby calculate the frequency distribution. Then, the histogram display unit 128 displays the histogram of the relevant frequency distribution.

Moreover, the state transition selection unit 130 causes the user of the observation apparatus 20 to select a notification condition on the number of sequences of the relevant output signals to be repeatedly outputted. Then, the state transition selection unit 130 records the state transition, which consecutively includes the designated number of sequences of the relevant output signals, in the designated information storage unit 135. As a result, in a case where the state transition, which corresponds to a pair of output signals newly acquired by the output signal acquisition unit 22, consecutively includes the designated number of sequences of the relevant output signals, the state transition notification unit 140 can make a notification that the state transition which consecutively includes the designated number of sequences of the relevant output signals occurs.

Moreover, for each of the number of sequence of the relevant output signals to be repeatedly outputted, the histogram display unit 128 may instruct the state transition selection unit 130 to make a notification that the state transition which consecutively includes the relevant designated number of sequences of the relevant output signals occurs, on condition that the frequency, which corresponds to the relevant number of sequences, is smaller than a predetermined threshold value. Accordingly, the state transition selection unit 130 records a state transition, which meets the condition, in the designated information storage unit 135. As a result, in a case where the state transition, which corresponds to the pair of output signals newly acquired by the output signal acquisition unit 22, consecutively includes a certain number of sequences of the relevant output signals, the state transition notification unit 140 can make a notification that the state transition which consecutively includes the sequences of the relevant output signals by the relevant number thereof occurs, if the frequency, which corresponds to the number of sequences, is smaller than the threshold value.

The aforementioned histogram display unit 128 makes it possible to clearly display the distribution of the number of sequences of the certain output signals to be consecutively outputted, and to appropriately set a condition of a notification of occurrence of the state transition based on the relevant distribution.

Figure 21:
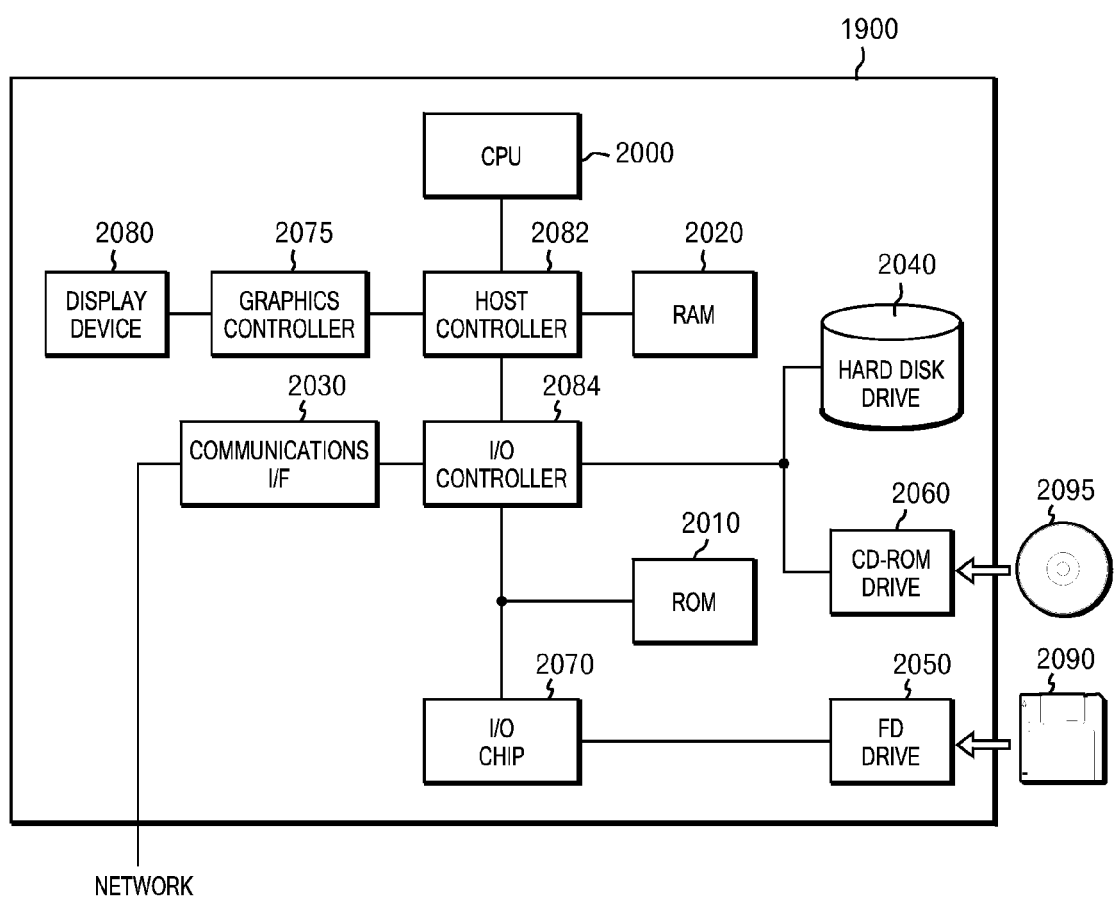
FIG. 21 shows an example of a hardware configuration of a computer 1900 according to the embodiment of the present invention.

FIG. 21 shows an example of a hardware configuration of a computer 1900 according to this embodiment. The computer 1900 according to this embodiment includes: a CPU peripheral unit having a CPU 2000, a RAM 2020, a graphics controller 2075, and a display device 2080, which are mutually connected to one another through a host controller 2082; an input and output unit having a communications interface 2030, a hard disk drive 2040, and a CD-ROM drive 2060, which are connected to the host controller 2082 through an input/output controller 2084; and a legacy input and output unit having a ROM 2010, a flexible disk drive 2050, and an input/output chip 2070, which are connected to the input/output controller 2084.

The host controller 2082 connects the RAM 2020, the CPU 2000 which accesses the RAM 2020 at a high transfer rate, and the graphics controller 2075 to one another. The CPU 2000 operates based on programs stored in the ROM 2010 and the RAM 2020 to control each unit. The graphics controller 2075 acquires image data that the CPU 2000 and the like generate on a frame buffer provided in the RAM 2020, and displays the acquired image data on the display device 2080. In place of the above, the graphics controller 2075 may include a frame buffer therein for storing image data which is generated by the CPU 2000 and the like.

The input/output controller 2084 connects the host controller 2082, the communications interface 2030 which is a relatively high-speed input/output device, the hard disk drive 2040, and the CD-ROM drive 2060 to one another. The communications interface 2030 communicates with the other devices via a network. The hard disk drive 2040 stores programs and data which are used by the CPU 2000 in the computer 1900. The CD-ROM drive 2060 reads the program or data from a CD-ROM 2095 to provide the read program or data to the hard disk drive 2040 through the RAM 2020.

Moreover, the ROM 2010, the flexible disk drive 2050, and a relatively low-speed input/output device of the input/output 2070 are connected to the input/output controller 2084. The ROM 2010 stores a boot program which is executed when the computer boots, and a program depending on hardware of the computer 1900. The flexible disk drive 2050 reads a program or data from a flexible disk 2090 to provide the read program or data to the hard disk drive 2040 through the RAM 2020. The input/output chip 2070 connects the flexible disk drive 2050, and connects various types of input/output devices through, for example, a parallel port, a serial port, a keyboard port, a mouse port, and the like.

Programs provided to the hard disk drive 2040 through the RAM 2020 are stored in the flexible disk 2090, CD-ROM 2095 or a storage medium such as an IC card, and are provided by the user. The programs are read from the storage medium, installed on the hard disk drive 2040 in the computer through the RAM 2020, and executed by the CPU 2000.

A program, which is installed in the computer 1900, and which causes the computer 1900 to function as the observation apparatus 20, includes an output signal acquisition module, a hysteresis processing module, a run length processing module, a transaction processing module having the state storage unit 52, the determination unit 54 and the separation unit 56, a first frequency measurement module, a second frequency measurement module, an idle specifying module, an output module, and a control module. The program or these modules instruct the CPU 2000 to cause the computer 1900 to function as the output signal acquisition unit 22, the hysteresis processing unit 24, the run length processing unit 26, the transaction processing unit 28 having the state storage unit 52, the determination unit 54 and the separation unit 56, the first frequency measurement unit 30, the second frequency measurement unit 32, the idle specifying unit 34, the output unit 36, and the control unit 38, respectively.

The aforementioned program or modules may be stored in an external storage medium. As a storage medium, it is possible to use an optical storage medium such as DVD and CD, a magneto-optical storage medium such as MO, a tape medium, and a semiconductor memory such as an IC card, in addition to the flexible disk 2090 and the CD-ROM 2095. Moreover, the program may be provided to the computer 1900 via the network, by use of a storage device such as a hard disk or RAM as a storage medium provided to a server system connected to the private telecommunication network or the Internet.

Although the invention has been described by use of the embodiment, the technical scope of the invention is not limited to the scope recited in the embodiment described above. It is obvious to those skilled in the art that various modifications and improvements may be applied to the embodiment. It is apparent from the scope of claims that embodiments thus modified or improved may be covered in the technical scope of the invention.

Although the preferred embodiment of the present invention has been described in detail, it should be understood that various changes, substitutions and alterations can be made therein without departing from spirit and scope of the invention as defined by the appended claims.

That which is claimed is:

1. A computer implemented observation method comprising a set of instructions stored in a computer readable medium that cause said computer to perform said method comprising:
   an output signal acquisition step of sequentially acquiring signal values with the microprocessor by observing signals outputted by the observation target apparatus;
   a state storage step of sequentially storing the acquired signal values;
   a determination step of determining whether or not a first signal value newly acquired is identical with a second signal value which is acquired prior to the first signal value, and which is stored in a state storage unit; and
   a separation step of separating and outputting a signal sequence with the microprocessor, which includes a plurality of signal values acquired between the first signal value and the second signal value, as transactions of an output signal on condition that it is determined that the first signal value is identical with the second signal value.

* * * * *